(12) United States Patent
Ito

(10) Patent No.: US 7,750,553 B2
(45) Date of Patent: Jul. 6, 2010

(54) ORGANIC EL ELEMENT PROVIDED WITH AN ELECTRODE IN A LIQUID STATE AND METHOD FOR PRODUCING THE SAME

(75) Inventor: Nobuyuki Ito, Tokyo (JP)

(73) Assignee: Dai Nippon Printing Co., Ltd., Tokyo-to (JP)

( * ) Notice: Subject to any disclaimer, the term of this patent is extended or adjusted under 35 U.S.C. 154(b) by 1161 days.

(21) Appl. No.: 11/191,189

(22) Filed: Jul. 27, 2005

(65) Prior Publication Data

US 2006/0066224 A1    Mar. 30, 2006

(30) Foreign Application Priority Data

Jul. 30, 2004   (JP) .............................. 2004-224350

(51) Int. Cl.
  *H05B 33/26* (2006.01)
  *H01L 51/52* (2006.01)
  *H05B 33/10* (2006.01)
  *H01L 51/56* (2006.01)

(52) U.S. Cl. ................ 313/503; 313/504; 313/506; 445/24; 445/25

(58) Field of Classification Search ......... 313/498–512; 428/690; 445/24, 25; 427/66
See application file for complete search history.

(56) References Cited

U.S. PATENT DOCUMENTS

| | | | |
|---|---|---|---|
| 4,356,429 A | 10/1982 | Tang | |
| 2002/0079832 A1 * | 6/2002 | Van Tongeren et al. | ..... 313/504 |

FOREIGN PATENT DOCUMENTS

| | | |
|---|---|---|
| JP | 57-51781 A | 3/1982 |
| JP | 61-020372 A | 1/1986 |
| JP | 05-074503 A | 3/1993 |
| JP | 06-283265 A | 10/1994 |
| JP | 07-057870 A | 3/1995 |
| JP | 09-320763 A | 12/1997 |
| JP | 10-012381 A | 1/1998 |
| JP | 11-329743 A | 11/1999 |
| JP | 11-329746 A | 11/1999 |
| JP | 2001-203076 A | 7/2001 |
| JP | 2002-100469 A | 4/2002 |
| JP | 2003-270647 A | 9/2003 |
| WO | 90/13148 A1 | 11/1990 |
| WO | 3 239 991 B2 | 4/1998 |
| WO | WO0193346 A2 | 12/2001 |
| WO | WO02052660 A1 | 7/2002 |

OTHER PUBLICATIONS

E.L. Frankevich & B.M. Rumyantsev, "Recombination luminescence of anthracene in a magnetic field", Soviet Physics, vol. 53, No. 6, Dec. 1967, pp. 1942-1954 & Inspec abstract No. 1968A18630.

* cited by examiner

*Primary Examiner*—Mariceli Santiago
(74) *Attorney, Agent, or Firm*—Ladas & Parry LLP

(57) ABSTRACT

The present invention provides an organic functional element such as an organic EL element, an organic TFT element or the like, wherein the organic functional element does not require vapor deposition in formation of an electrode on an organic material layer, and does not cause an electrode breaking even when bended, and a method for producing the same. An organic functional element of the present invention at least comprises more than one electrode and an organic material layer, wherein at least one electrode is made of a liquid metal.

26 Claims, 10 Drawing Sheets

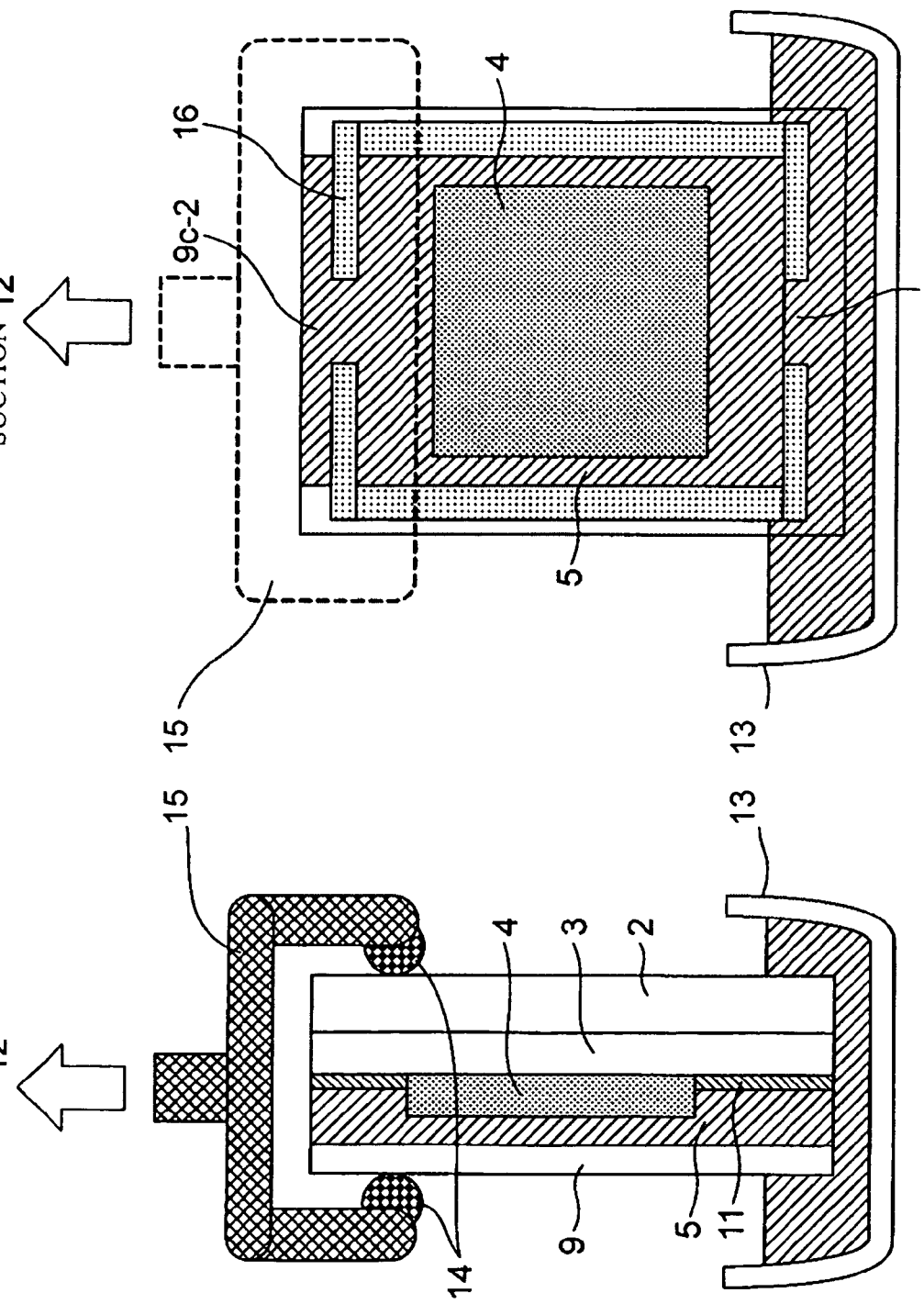
FIG. 5A CROSS-SECTIONAL VIEW
FIG. 5B FRONT VIEW

ORGANIC EL ELEMENT PROVIDED WITH AN ELECTRODE IN A LIQUID STATE AND METHOD FOR PRODUCING THE SAME

BACKGROUND OF THE INVENTION

1. Field of the Invention

The present invention relates to an organic functional element, particularly, an organic semiconductor element, an organic thin film transistor element (hereinafter, a thin film transistor may be referred to as a TFT), an organic electroluminescence element (hereinafter, an electroluminescence may be referred to as an EL), and a method for producing the same.

2. Description of the Related Art

In recent years, a flat display has been used in many fields and places, and importance thereof has increasingly enhanced with advancement of informatization. Currently, a representative of a flat display is a liquid crystal display (also referred to as LCD) and, as a flat display based on different display principle from that of LCD, organic EL, inorganic EL, a plasma display panel (also referred to as PDP), a light emitting diode display (also referred to as LED), a vacuum fluorescent display (also referred to as VFD), and a field emission display (also referred to FED) have been also actively developed. All of these new flat displays are called self-emitting types, are considerably different from LCD in the following points, and have excellent characteristics which are not possessed by LCD.

LCD is called as a light receiving type, and a liquid crystal does not emit the light by itself, works as a so-called shutter which permeates and shields the light from the light source, and constitutes a display. For this reason, LCD requires a light source, and generally requires back light. To the contrary, a self-emitting type does not require another light source since an apparatus itself emits the light. In the light receiving type such as LCD, a back light is always turned on irrespective of a state of display information, and consumes approximately the same electric power as that of the full display state. To the contrary, the self-emitting type consumes an electric power only at a place requiring turning on depending on display information, it has in principle an advantage that electric power consumption is small as compared with the light receiving-type display.

Similarly, in the LCD, in order to obtain the dark state by shielding the light of a back light source, it is difficult to completely exclude light leakage even if the quantity of light is small, while in the self-emitting type, no emitting state is just the dark state, it is easy to obtain an ideal dark state, and the self-emitting type is predominantly prevails also in a contrast.

In addition, since the LCD utilizes polarization control by virtue of birefringence of a liquid crystal, so-called viewing angle dependency in which the display state is greatly changed depending on a direction of observation is great, but there is little of this problem in the self-emitting type.

Further, since the LCD utilizes an orientation change derived from dielectric anisotropy of a liquid crystal which is an organic elastic substance, a response time to an electric signal is in principle 1 ms or longer. To the contrary, in technique of the aforementioned self-emitting type which is being developed, since transition of a so-called carrier such as electron/hole, electron release, plasma discharge or the like is utilized, a response time is in an order of ns, which is a dramatically high rate as compared with a liquid crystal, and there is no problem of animation afterimage derived from slowness of response of LCD.

Among them, particularly, an organic EL has been actively studied. An organic EL is also called as an OEL (Organic EL) or an organic light emitting diode (OLED).

An OEL element and an OLED element have a structure in which a layer (EL layer) containing an organic compound is disposed between one pair of electrodes, i.e. an anode and a cathode, which is based on a laminated structure of "anode/hole injection layer/light emitting layer/cathode" of Tan et al (for example, see Japanese Patent No. 1,526,026). Tan et al. use a low-molecular material while Henry et al. use a high-molecular material (for example, see Japanese Patent No. 3,239,991).

In addition, an efficiency is improved by using a hole injection layer or an electron injection layer, and an emitting color is controlled by doping a light emitting layer with a fluorescent dye or the like. Also, in an organic EL, high luminance light emission can be obtained at relatively low voltage driving like as 10 V or less, application as an illuminating device in place of a fluorescent lamp having a problem of use of mercury is expected.

FIG. 10 is a schematic view showing a basic cross-sectional structure of a conventional organic EL element 101. An organic EL element 101 has a basic structure in which an organic material layer containing at least a light emitting layer (EL layer) 104 is disposed between an anode 103 and a cathode 105, and by applying the electric field between both electrodes to flow a current through the EL layer, the light is whereby emitted. The light emitting layer 104 may be a multilayered structure provided with an auxiliary layer such as a hole injection layer 106 or an electron injection layer 107, if necessary.

Usually, an organic EL element 101 is produced by forming a transparent electrode as an anode 103 on a translucent substrate 102 such as a glass substrate and a plastic substrate due to a work function of a transparent electrode such as ITO with respect to an energy level of an EL layer, and thereafter, forming an EL layer which is a light emitting layer 104, and a cathode 105 which is a counter electrode in this order. In the organic EL element 101 having such a construction, light emission 108 can be observed from a transparent electrode (anode 103) side.

Conventionally, an organic EL element has utilized only fluorescent emission when returned from the singlet excitation to the ground state, but in recent study, effective utilization of phosphorescent emission when returned from the triplet excitation state to the ground state has been enabled and the efficiency thereof improved.

A transparent electrode can be prepared by sputtering or vacuum-depositing a transparent electrically conductive film of ITO or IZO on a transparent substrate, separately from formation of an EL layer thereafter.

As a forming method of the EL layer, generally, when a low-molecular material is used as a material for the EL layer, a vacuum evaporation method using a mask is used. In the case of a high-molecular material, the material is formulated into a solution, and an ink jet method, a spin-coating method, a printing method, a transferring method or the like is used. In recent years, a low-molecular material which can be coated has been also reported.

Among them, in a mask vacuum evaporation method of a low-molecular material, from restriction that scale up of a vacuum device and a depositing mask is difficult, therefore, there is a problem that meeting scale up and production of many pieces using a large substrate are difficult. This means that there is no problem at a scale of around experimental production at a development stage, but market competitiveness is weak in terms of a tact and a cost at a regular production stage.

On the other hand, in a high-molecular material, and a low-molecular material which can be coated, since a film can be formed by a wet process such as an ink jet method, a printing method, a casting method, an alternate adsorbing method, a spin-coating method, a dipping method or the like, there is little problem of meeting a large substrate as aforementioned, and as a method of forming an organic EL element, a coating process is promising. For example, by dissolving PPV (poly(p-phenylenevinylene)), which is a high-molecular organic EL material described in Japanese Patent No. 3,239,991, in an organic solvent, and spin-coating the solution on a transparent electrode, an EL layer can be formed.

Finally, for example, a film of a low work function metal such as Al, Ag or the like is made by vacuum vapor deposition to obtain a cathode. However, in the aforementioned production method, since a film of a cathode is made by vapor deposition, a vacuum device requiring a laborious work becomes necessary only in a step of forming a cathode, and a production tact is stopped due to vacuuming, therefore, there is a problem that characteristic of an organic EL material which can be formulated into a film by coating, cannot be sufficiently utilized.

Another characteristic of an organic EL composed of a coated film is flexibility. When an element is constituted using a flexible substrate such as a resin, a plastic or the like, a soft, so-called flexible element can be produced and, also in this case, a cathode has been problematic in the prior art. Even when a substrate and an organic material layer are made to have a flexible structure, if a metal thin film formed by vapor deposition as conventional is used as an electrode, breaking cannot be avoided when bended.

As utilization of Ga and a Ga alloy, which are a liquid metal, as an electrode in a broad sense, there is the invention of use in an electric connecting means (see Japanese Patent Application Laid-Open (JP-A) No. 5-74,503). This pays an attention to easiness in bonding and peeling easiness of a liquid metal, and utilizes the liquid metal in a contact point of a connector pin or the like, but utilization as an electrode for flowing electricity through an organic material layer or acting the electric field on the organic material layer in order to exhibit function of an organic functional element is not described therein.

In an organic functional element, it is important to inject more charges, particularly electrons, in an organic material layer. A substance having a low work function has better electron injection effect. In this point, an alkali metal and an alkaline-earth metal are suitable. In the conventional organic EL element produced by vapor deposition or the like, it is general to laminate an alkali metal or an alkaline-earth metal and other metal. In addition, use of an alloy of an alkali metal or an alkaline-earth metal and other metal in an electron injection electrode of an organic EL element has been proposed (for example, see JP-A No. Hei. 9-320,763, JP-A No. Hei. 10-12,381 and JP-A No. Hei. 11-329,746).

However, in organic EL elements described in JP-A No. Hei. 9-320,763, JP-A No. Hei. 10-12,381 and JP-A No. Hei. 11-329,746, since an alkali metal and an alkaline-earth metal are unstable for having strong oxidizing property and flammability in the air, it is difficult to handle them and, conventionally, a film was made only by vapor deposition under vacuum.

In the technique described in JP-A No. Hei. 9-320,763, JP-A NO. Hei. 10-12,381 and JP-A No. Hei. 11-329,746, for example, an alloy region containing an alkali metal or an alkaline-earth metal is formed near a light emitting layer by vapor-codepositing various metals each of which is used as an independent vapor deposition source, and an electrode is formed by vacuum vapor deposition. Although other techniques use an alloy of an alkali metal or an alkaline-earth metal and other metal, an electrode is formed by a vapor deposition method or a sputtering method using an alloy as a target material.

The aforementioned problems are not limited to an organic EL element. There is the similar problem in all organic functional elements composed of an organic material layer and an electrode.

SUMMARY OF THE INVENTION

The present invention has been achieved in light of the above-stated conventional problems. An object of the present invention is to provide an organic functional element such as an organic semiconductor element, typically an organic TFT element, an organic EL element or the like, wherein the organic functional element does not require vapor deposition information of an electrode on an organic material layer, can be easily scaled up, can reduce a production cost, and has high reliance so that an electrode does not cause breaking even when bended, and a method for producing the same.

In order to attain the above object, an organic functional element of the present invention is an organic functional element at least comprising more than one electrode and an organic material layer, wherein at least one electrode is made of a liquid metal.

As the liquid metal, Ga and a Ga alloy are preferable. As a metal which can maintain the liquid state at a lower temperature in comparison with Ga alone, a Ga alloy containing at least Ga and one or more other metals selected from the group consisting of In, Sn and Zn is preferable.

The electrode may be made of a liquid metal containing an alkali metal and/or an alkaline-earth metal. By using a liquid metal containing an alkali metal and an alkaline-earth metal which are a substance having a low work function, an electrode having a high electron injection effect is obtained.

As one of the preferable embodiments, the aforementioned Ga or Ga alloy containing an alkali metal and/or an alkaline-earth metal can be used.

It is preferable that an amount of an alkali metal and/or an alkaline-earth metal to be added is around 0.01 to 1% with respect to a matrix metal expressed as a volume ratio or a weight ratio.

It is preferable that the alkali metal and/or alkaline-earth metal selected from the group consisting of Ca, Li, Cs, Mg, Sr and Ba is used.

An electrode formed of a liquid metal can be in a form of a gap part filled with the liquid metal, the gap part being defined by determining a periphery of a space between the organic material layer and a substrate disposed so as to face the organic material layer.

A method for producing an organic functional element of the present invention comprises steps of:

laminating a first substrate having the organic material layer and a second substrate having a storing portion facing the organic material layer, the storing portion being defined by determining a periphery of the storing portion so as to have a predetermined depth and be capable of keeping the liquid metal which constitutes at least one electrode inside the determined periphery; and sealing the liquid metal in the storing portion to form the electrode.

In addition, other method for producing an organic functional element of the present invention comprises steps of:

forming a gap part which is defined by determining a periphery of a space between the organic material layer and a substrate disposed so as to face the organic material layer and provided with one or more holes leading to the exterior; and injecting the liquid metal into the gap part through the hole to form at least one electrode.

In the aforementioned method, the liquid metal is easily injected to the gap part by placing the liquid metal on at least one hole of the gap part and evacuating the gap part.

Also, the liquid metal is easily injected to the gap part by forming a gap part having two or more holes, placing the liquid metal on at least one hole of the gap part, and suctioning a gas from at least one hole of the gap part not having the liquid metal placed.

In any methods described above, it is preferable that the gap part is placed in an atmosphere of an inert gas to inject the liquid metal, or evacuate or suction a gas.

It is preferable to use nitrogen, argon, or a mixed gas of nitrogen and argon as the inert gas.

In the aforementioned method, a form of the electrode can be defined to a certain form depending on a form of the storing portion or the gap part.

In particular, by forming a storing portion or a gap part into a striped form, a pixel electrode for constituting a display can be formed.

As a substrate having the storing portion or the gap part or disposed so as to face the organic material layer, glass, metal, ceramic, resin or a composite material having two or more kinds selected from the group consisting of glass, metal, ceramic and resin mixed or laminated can be used.

The aforementioned organic functional element of the present invention and the method for producing the same can be applied to an organic EL element, an organic TFT element, and an organic semiconductor element.

According to the present invention as described above, an electrode can be formed on an organic material layer without using a vacuum film-forming method such as vapor deposition or the like to produce an organic functional element, particularly, an organic EL element and an organic TFT element.

When an electrode of an organic functional element is formed using a liquid metal, an electrode having a desired shape can be formed by a coating method such as printing at a normal temperature or under mild warming or the like, or other wet process without using a vapor phase process such as vapor deposition or the like. Therefore, since a cost of the process is low and a size of an electrode is not restricted by a size of a vapor deposition device, scale up of an organic functional element, and reduction in a production cost can be realized.

Also, in an electrode formed of a liquid metal, breaking is not caused and, even when separated by pressure or the like, separated metals flow and are unified again, therefore, a problem of breaking is not substantially caused. Hence, an organic functional element having high reliance in which breaking is not caused in an electrode is obtained, and the organic functional element can be also suitably utilized as a flexible element.

An alkali metal or an alkaline-earth metal has strong oxidizing property and flammability, is unstable and is difficult to handle. In contrast, in the present invention, when an alkali metal or an alkaline-earth metal is added to an electrode, it is very easy to handle the alkali metal or the alkaline-earth metal since an alkali metal or an alkaline-earth metal is mixed to a liquid metal, and an electrode can be formed using a wet process.

In the present invention, since an electrode can be defined into a certain form depending on a form of the storing portion or the gap part, it is easy to control a form of an electrode as compared with a method of using a mask in a vapor phase process such as vapor deposition or the like, or performing etching after deposition.

In the organic functional element of the present invention, since an element can be produced in vacuum or in an inert gas, light emitting uniformity on a light emitting surface can be further improved. Also, since a form of an electrode can be optionally controlled as described above, a completion degree as a light emitting element can be improved.

BRIEF DESCRIPTION OF THE DRAWINGS

In the accompanying drawings,

FIGS. 5A and 5B are a view showing a preferable step included in the method shown in FIG. 4;

The numerical symbol in each figure refers to the following: 1: an organic EL element, 2: a first substrate, 3: an anode, 4: a light emitting layer, 5: a cathode, 6: a hole injection layer, 7: an electron injection layer, 8: light emission, 9: a second substrate, 9a: a storing portion, 9b: a gap part, 9c: a pore portion, 10: a liquid metal, 11: an insulating layer, 12: sucking the air, 13: a container, 14: a packing, 15: a partition member, 16: a sealing material, 17: a stripe part, 20: a display part, 21: an operation part, 22: an equipment, 23: a lens, 40: a gate electrode, 41: a source electrode, 42: a drain electrode, 43: an organic semiconductor layer, 44: an insulating layer, 101: a conventional organic EL element, 102: a substrate, 103: an anode, 104: a light emitting layer, 105: a cathode, 106: a hole injection layer, 107: an electron injection layer, and 108: light emission.

DETAILED DESCRIPTION OF THE INVENTION

The present invention is an organic functional element at least comprising more than one electrode and an organic material layer, wherein at least one electrode is made of a liquid metal.

In the present invention, an organic functional element is an element in which an organic material layer is made to exhibit predetermined function such as light emitting, switching or the like by passing electricity through an organic material layer or applying the electric field to an organic material layer. Specific examples include an organic semiconductor element such as an organic TFT element in addition to an organic EL element. An organic material layer has a monolayered or multilayered structure having at least one layer containing an organic material, and exhibits predetermined function by electricity passing or application of the electric field.

Figure 1:
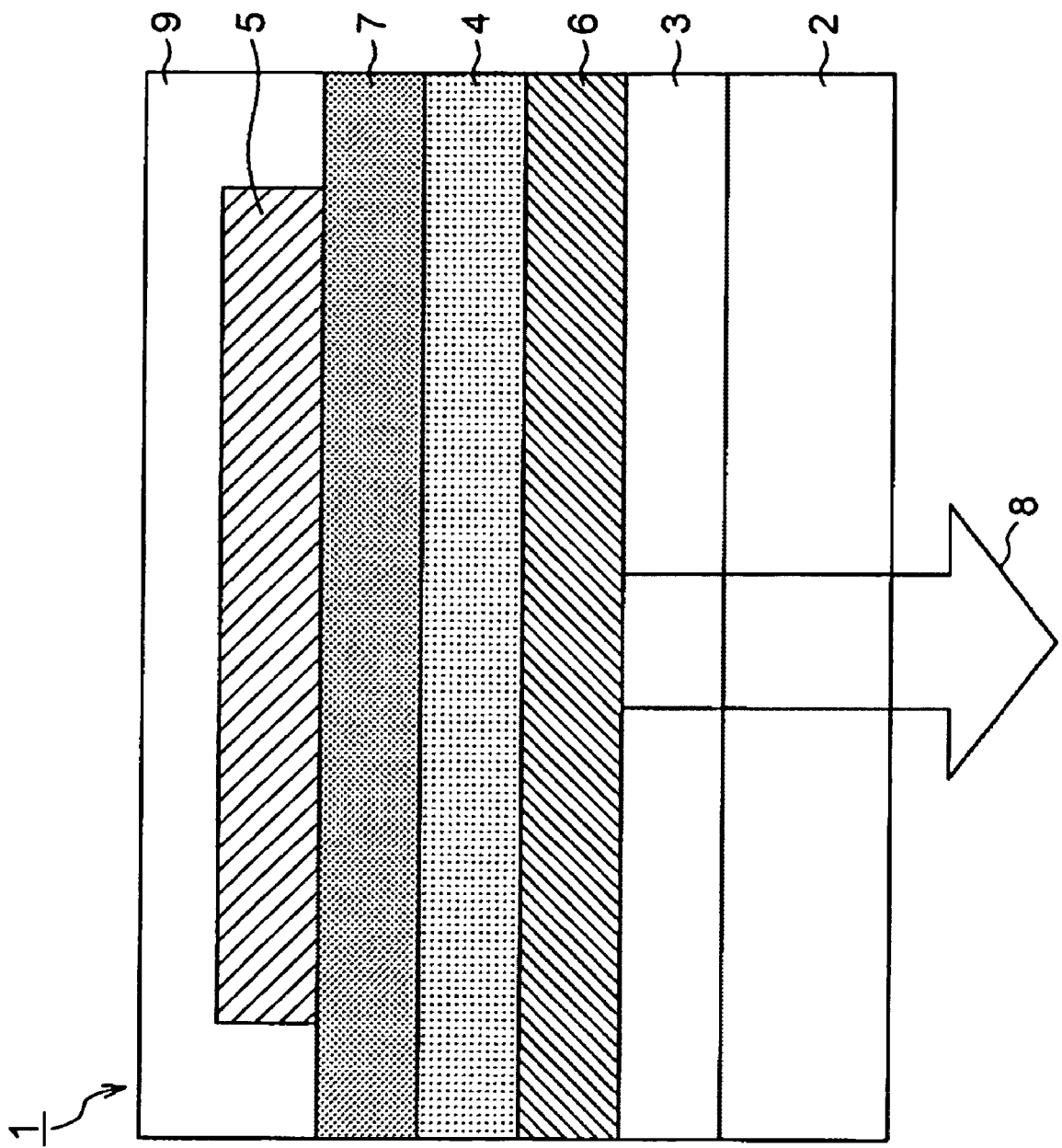
FIG. 1 is a schematic view showing a cross-sectional structure of one embodiment of an organic EL element of the present invention.

The present invention will be explained below referring to an example of an organic EL element. FIG. 1 is a cross-sectional view schematically showing one example of a laminated structure of an organic EL element 1 of the present invention. The organic EL element 1 has a structure in which a transparent electrode as an anode 3, a hole injection layer 6, a light emitting layer (EL layer) 4, an electron injecting layer 7, a cathode 5, and a second substrate 9 are laminated in this order on one side of a transparent substrate which is a first substrate 2, and light emission 8 from the light emitting layer 4 can be observed visually through the transparent anode 3 and first substrate 2.

This example has two electrodes of the anode 3 and the cathode 5. Among them, the cathode 5 is formed by filling a liquid metal into a gap part having a predetermined two-dimensional shape, which is defined by the electron injection layer 7 and a hollow space (storing portion) disposed on one side of the second substrate 9, followed by sealing.

In order to utilize a liquid metal having flowability at a normal temperature as an electrode material, in the present invention, a liquid metal is filled into a part on which an electrode of an organic functional element is to be formed, in conformity with a shape and a size of an electrode, followed by sealing.

The gap part is a space for filling a liquid metal in which a periphery of a space having a two-dimensional directional extension held between an organic material layer and a substrate opposing the organic material layer is defined in conformity with a shape and a size of an electrode.

In the example, the gap part is formed utilizing the substrate on which the storing portion is disposed, but a gap part may be formed without utilizing a substrate depending on an element to be produced. For example, when a drain electrode 42 of a top and bottom contact-type TFT element shown in FIG. 8C is formed of a liquid metal, a structure is formed, in which a storing portion opening towards an insulating layer 44 is disposed in an organic semiconductor layer 43, and the storing portion is closed with the insulating layer 44 to define a gap part, and a liquid metal which is a drain electrode material is filled.

The hollow space (storing portion) which is disposed on one side of the second substrate for holding a liquid metal may be a concave part in which the substrate itself is depressed (see FIG. 1), or may be a space in which a barrier made of a different material (e.g. photocuring or thermosetting resin sealing material) from a substrate is formed on one surface side of the substrate, to surround a two-dimensional shape which is to be an electrode. An electrode made of a liquid metal is defined by a shape of the storing portion or a gap part in which the storing portion is closed.

The example has the organic material layer composed of three layers of the hole injection layer 6, the light emitting layer 4 and the electron injection layer 7. The organic material layer of the organic EL element may take a multilayered structure in which one or more auxiliary layers such as the hole injection layer 6, the electron injection layer 7 or the like are added to the light emitting layer 4 if necessary. By addition of the auxiliary layers, the effect of improving light emitting action such as higher efficiency, longer life and the like is obtained.

Herein, unless otherwise indicated, a hole injection layer alone, a hole transporting layer alone, a combination of a hole injection layer and a hole transporting layer, and a layer having both of hole injection action and hole transporting action are collectively referred to as hole injection layer, and an electron injection layer alone, an electron transporting layer alone, a combination of an electron injection layer and an electron transporting layer, and a layer having both of electron injection action and electron transporting action are collectively referred to as electron injection layer.

(1) Electrode Made of Liquid Metal (Cathode)

In the present invention, at least one electrode contained in an organic functional element is formed with a liquid metal. For example, in an organic EL element 1 of FIG. 1, a cathode is formed of a liquid metal. However, in the present invention, an anode may be formed of a liquid metal.

In the present invention, a liquid metal for forming an electrode means a metal which is in the liquid state at a normal temperature (for example, 5 to 45° C.), and exhibits sufficient flowability at a normal temperature or at a relatively low temperature up to around a metal temperature of 50° C. even when heated. It is preferable that a melting point of a metal is 50° C. or lower.

Such a liquid metal can be formed into a film by a wet process at a normal temperature or under mild heating, and can be formed into an electrode having a desired shape by a coating method such as printing or the like, or by other wet process without using a vapor phase process such as vapor deposition or the like. Therefore, a production cost is low as compared with a vapor phase process, and since a size of an electrode is not restricted by a size of a vapor deposition device in a production process, scale up of an organic functional element, and reduction in a production cost can be attained.

In addition, breaking is not caused in an electrode made of a liquid metal. Even when separated by a pressure or the like, since when an organic functional element is allowed to be left at a normal temperature or under mild heating or be tilted, separated metals flow to be unified again, a problem of breaking is not substantially caused. Therefore, an organic functional element having high reliance in which breaking is not caused is obtained, and when a flexible substrate made of a flexible material such as a plastic or the like is used, this can be suitably utilized as a flexible element.

As a liquid metal, Ga or a Ga alloy is preferably used in view of flowability at a normal temperature and little toxicity. In the present invention, an alloy is a metal composed of two or more kinds of metals, which is apparently uniform, and it is not required that a metal bond is necessarily formed between different kinds of metals. In addition, in the present invention, a Ga alloy contains Ga as a main component, and Ga accounts for preferably 40% by weight, more preferably 50% by weight of a metal constituting a Ga alloy.

A Ga simple substance has a melting point of 30° C. and a boiling point of 2,400° C., thus, is a liquid in a wide temperature range from room temperature to a high temperature. As a metal which can maintain the liquid state at a lower temperature, a Ga alloy containing Ga and, at the same time, at least one kind of other metal among In, Sn and Zn as an essential component, can be employed. A composition ratio and a melting point of Ga and a Ga alloy which can be used as an electrode in the present invention are exemplified in Table 1.

TABLE 1

| No. | Alloy component (% by weight) | Melting point (° C.) |
| --- | --- | --- |
| 1 | Ga | 30 |
| 2 | Ga-In (75.5%:24.5%) | 16 |
| 3 | Ga-In-Sn (62.0%:25.0%:13.0%) | 5 |
| 4 | Ga-In-Zn (67.0%:29.0%:4.0%) | 13 |
| 5 | Ga-Sn (92.0%:8.0%) | 20 |
| 6 | Ga-Zn (95.0%:5.0%) | 25 |

A composition of an alloy (cathode) as described herein means a charging weight of each metal component which has been weighed in advance, or a composition based on measurement results by an X ray diffraction method, a XPS method or other proper method.

In an organic EL element 1, in order to produce an element which is practical in properties such as a voltage, a luminance and an efficiency, and in other organic functional element, in order that a higher current can be controlled, an electrode having a better charge injection efficiency (hole injecting efficiency in an anode, electron injecting efficiency in a cathode) is preferable. From a viewpoint of easy release of an electron, a metal having a low work function is used in a cathode, and Al having a work function of 4.2 eV is suitably used as a representative metal in a conventional cathode.

When Ga or a Ga alloy is used as a cathode in the present invention, since a work function of Ga is 4.3 eV which is near that of Al, there is an advantage as a liquid metal, and also an advantage that electron injection from a cathode into an EL layer becomes better.

If necessary, other components may be added to the liquid metal which forms an electrode. For example, in order to improve an electron injecting efficiency of a cathode, as a substance having a low work function, at least one kind selected from an alkali metal and an alkaline-earth metal may be added to a cathode.

An amount of an alkali metal or an alkaline-earth metal to be added for exhibiting high electron injecting function is preferably 0.01 to 1%, more preferably 0.05 to 0.5% with respect to a matrix metal as expressed by a volume ratio or a weight ratio. When the addition amount is in this range, a melting point of a matrix metal is not changed. Further, a cathode having a high electric power conversion efficiency and a long element life can be easily obtained, and light emitting uniformity of an element is also improved.

It is preferable that an alkali metal or an alkaline-earth metal is selected from the group consisting of Ca (work function 2.87 eV), Li (work function 2.9 eV), Cs (work function 2.14 eV), Mg (work function 3.66 eV), Sr (work function 2.59 eV) and Ba (work function 2.52 eV). In the present invention, a value of a "work function" of each element is based on data described in "J. Appl. Phys. vol. 48" (1977), pp. 4,729, and data actually measured by an ionization potential measuring apparatus.

Conventionally, since an alkali metal or an alkaline-earth metal has strong oxidizing property and flammability, being unstable, and difficult to be handled, the metal was used only in a film making process under vacuum. To the contrary, in the present invention, since an alkali metal or an alkaline-earth metal is mixed into a liquid metal, and the mixture can be used in a wet process to form an electrode, therefore, this is very easy to be handled.

As a method of inclusion of an alkaline metal or an alkaline-earth metal into a liquid metal in Table 1 as a matrix, usually, this can be done by a method of handling these air combustible metals. For example, there is a method of melting, mixing and cooling a liquid metal such as Ga and a Ga alloy, and at least one kind selected from an alkali metal and an alkaline-earth metal, in a heating furnace replaced with an inert gas such as nitrogen, argon or the like, or a vacuum heating furnace.

In the present invention, an electrode formed of a liquid metal is an electrode which is disposed in the interior or on a surface of an organic functional element for passing electricity through an organic material layer of an organic functional element, or applying the electric field to an organic material layer of an organic functional element, and does not electrically connect an element and the outside.

A shape of an electrode formed of a liquid metal varies depending on an element, and there can be exemplified a shape having a two dimensional extension such as a thin layer, a stripe or the like, and in the case of a TFT element, a spot shape or the like. In addition, a size and a thickness thereof vary depending on an element, and a thickness is generally around 0.1 μm to 100 μm.

(2) Layers or Portions Other than Electrode Made of Liquid Metal

In the present invention, as layers or portions other than the electrode made of a liquid metal, the conventionally known layers or portions can be used according to a construction of an organic functional element, and may not be limited. Materials which can be used in an organic EL element 1 shown in FIG. 1 will be explained below.

<Substrate>

A substrate is used, if necessary, as a support of an organic functional element, or for sealing an electrode made of a liquid metal. Further, a second substrate 9 having a storage portion for molding an electrode functions also as a sealing material (sealing layer) for sequestering an organic functional material which is easily deteriorated by a moisture or oxygen from the air.

As a substrate of an organic EL element of the present invention, in view of productivity and a cost of a substrate having a storing portion, a substrate selected from any one kind of a glass, a resin, a metal and a ceramic, or a substrate formed of a composite material in which two or more kinds of materials are mixed or laminated is desirable.

When a substrate is to be a light taking out surface, a transparent substrate is used. It is sufficient if a transparent material consists of a material imparting high permeability (approximately 80% or more) for light emitting (EL light) from a light emitting layer. For example, there may be plates, sheets and films of transparent glasses such as alkali glass, alkali-free glass or the like, transparent resins such as polyethylene terephthalate, polycarbonate, polyether sulfone, polyether ether ketone, polyvinyl fluoride, polyacrylate, polypropylene, polyethylene, amorphous polyolefin, fluorine-based resin or the like, or quartz or the like. A transparent substrate can be appropriately selected according to the purpose or the like of an objective organic EL element.

On the other hand, when a substrate is not used as a light taking out surface, materials other than the aforementioned transparent substrate can be utilized as a substrate.

<Organic Material Layer>

In the organic EL element of the preset invention, a layer constitution of an organic material layer is not particularly limited. There are various layer constitutions of an organic EL element. As examples of a layer constitution of an organic EL element of a type, in which a layer is formed on a transparent substrate and the transparent substrate is a light taking out surface, there may be constructions in which a laminating order on a transparent substrate is the following (i) to (iv). When a substrate is not a light taking out surface, a laminating order on a substrate can be reversed of the following (i) to (iv):
(i) anode/light emitting layer/cathode;
(ii) anode/hole injection layer/light emitting layer/cathode;
(iii) anode/light emitting layer/electron injection layer/cathode; and
(iv) anode/hole injection layer/light emitting layer/electron injection layer/cathode.

In the organic EL element of the (i) type and the organic EL element of a type in which a laminating order is reverse of the (i), a light emitting layer corresponds to an organic material layer of a monolayered structure. In the organic EL element of the (ii) type and the organic EL element of a type in which a laminating order is reverse of the (ii), a hole injection layer and a light emitting layer correspond to an organic material layer of a multilayered structure. In the organic EL element of the (iii) type and the organic EL element of a type in which a laminating order is reverse of the (iii), a light emitting layer and an electron injection layer correspond to an organic material layer of a multilayered structure. In the organic EL element of the (iv) type and the organic EL element of a type in which a laminating order is reverse of the (iv), a hole injection layer, a light emitting layer and an electron injection layer correspond to an organic material layer of a multilayered structure.

In the present invention, from a viewpoint that the effect of scale up of an element and reduction in a production cost is enhanced, it is preferable that not only an electrode but also an organic material layer are formed by a wet process. In order to form an organic material layer by a wet process, organic materials such as a light emitting layer material, a hole injection layer material, an electron injection layer material or the like are dissolved in a solvent, if necessary, using a binder or a dispersant, and the solution may be coated on a predetermined surface to be coated by the known coating method such as spin-coating or the like.

A light emitting layer material, a hole injection layer material and an electron injection layer material will be explained below.

(a) Light Emitting Layer

An organic light emitting material used as a material for a light emitting layer is sufficient if it has three functions of (a) charge injecting function, that is, function capable of injecting a hole from an anode or a hole injection layer at application of the electric field, and capable of injecting an electron from a cathode or an electron injection layer, (b) transporting function, that is, function of transporting the injected hole and electron with a force of the electric field, and (c) light emitting function, that is, function of providing the field of recombination of an electron and a hole, and leading them to light emitting. However, it is not necessarily required that sufficient performance of each function of the (a) to (c) is possessed at the same time, for example, there is a suitable organic light emitting material among organic light emitting materials in which hole injecting and transporting property is greatly superior over electron injecting and transporting property.

As an organic light emitting material, a fluorescent brightening agent such as benzothiazole series, benzoimidazole series, benzoxazole series or the like, as well as a styrylbenzene-based compound or the like can be used.

As examples of the fluorescent brightening agent, there may be as a benzoxazole series, 2,5-bis(5,7-di-t-pentyl-2-benzoxazolyl)-1,3,4-thiadiazole, 4,4'-bis(5,7-t-pentyl-2-benzoxazolyl)stilbene, 4,4'-bis[5,7-di-(2-methyl-2-butyl)-2-benzoxazolyl]stilbene, 2,5-bis(5,7-di-t-pentyl-2-benzoxazolyl)thiophene, 2,5-bis[5-a,a-dimethylbenzyl-2-benzoxazolyl]thiophene, 2,5-bis[5,7-di-(2-methyl-2-butyl)-2-benzoxazolyl]-3,4-diphenylthiophene, 2,5-bis(5-methyl-2-benzoxazolyl)thiophene, 4,4'-bis(2-benzoxazolyl) biphenyl, 5-methyl-2-[2-[4-(5-methyl-2-benzoxazolyl) phenyl]vinyl] benzoxazole, 2-[2-(4-cholorophenyl)vinyl] naphtho[1,2-d]oxazole or the like, as a benzothiazole series, 2,2'-(p-phenylenedivinylene)-bisbenzothiazole or the like, and as a benzimidazole series, 2-[2-[4-(2-benzimidazolyl) phenyl]vinyl]benzimidazole, 2-[2-(4-carboxyphenyl)vinyl] benzimidazole or the like.

As examples of the styrylbenzene-based compound, there may be 1,4-bis(2-methylstyryl)benzene, 1,4-bis(3-methylstyrly)benzene, 1,4-bis(4-methylstyryl)benzene, distyrylbenzene, 1,4-bis(2-ethylstyrylbenzene), 1,4-bis(3-ethylstyryl)benzene, 1,4-bis(2-methylstyryl)-2-methylbenzene, 1,4-bis(2-methylstyryl)-2-ethylbenzene or the like.

Further, in addition to the aforementioned fluorescent brightening agent and styryl-based compound, for example, 12-phthaloperynone, 1,4-diphenyl-1,3-butadiene, 1,1,4,4-tetraphenyl-1,3-butadiene, naphthalimide derivatives, perylene derivatives, oxadiazole derivatives, aldazine derivatives, pyraziline derivatives, cyclopentadiene derivatives, pyrrolopyrrole derivatives, styrylamine derivatives, coumarin-based compounds, polymer compounds such as those described in International Publication Gazette WO90/13,148 and Appl. Phys. Lett., vol. 58, 18, P 1,982 (1991), aromatic dimethylidyne-based compounds, a compound represented by the following general formula (I) or the like can be also used as an organic light emitting material:

$$(R-Q)_2-Al-O-L \quad (I)$$

wherein, "L" represents a hydrocarbon having 6 to 24 carbons containing a phenyl part; "O-L" represents a phenolate ligand; "Q" represents a substituted 8-quinolinolate ligand; and "R" represents a 8-quinolinolate ring substituent selected so that bonding of more than two substituted 8-quinolinolate ligands to an aluminum atom is sterically prevented.

Herein, as examples of the aromatic dimethylidyne-based compound, there may be 1,4-phenylenedimethylidine, 4,4'-phenylenedimethylidine, 2,5-xylilenedimethylidine, 2,6-naphthylenedimethylidine, 1,4-biphenylenedimethylidine, 1-4-p-terephenylenedimethylidine, 4,4'-bis(2,2-di-t-butylphenylvinyl)biphenyl, 4-4'-bis(2,2-diphenylvinyl)biphenyl or the like, and derivatives of them. As examples of the compound represented by the general formula (I), there may be bis(2-methyl-8-quinolinolato)(p-phenylphenolato)aluminum (III), bis(2-methyl-8-quinolinolato) (1-naphtholato)aluminum(III) or the like.

Besides, a compound in which the aforementioned organic light emitting material is a host, and the host is doped with an intense fluorescent dye from blue to green, for example, a coumarin-based fluorescent dye or the same fluorescent dye as that of the host, is also suitable as an organic light emitting material. When the aforementioned compound is used as an organic emitting material, light emitting from blue to green (light emitting color is different depending on kind of dopant) can be obtained at a high efficiency. As examples of a host which is a material of the aforementioned compound, there may be an organic light emitting material having a distyrylarylene structure (particularly preferably, for example, 4,4'-bis (2,2-diphenylvinyl)biphenyl). As examples of a dopant which is a material of the aforementioned compound, there may be diphenylaminovinylarylene (particularly preferably, for example, N,N-diphenylaminobiphenylbenzene) and 4,4'-bis[2-[4-(N,N-di-p-tolyl)phenyl]vinyl]biphenyl).

A film thickness of the light emitting layer is not particularly limited, but can be appropriately set according to the situations, and usually a range of 5 nm to 5 µm is preferable.

(b) Hole Injection Layer

A material of a hole injection layer provided optionally (hereinafter, referred to as "hole injecting material") may be any material as far as it has hole injecting property or electron barrier property. For example, materials which have conventionally been used as a hole injecting material of a photosensitive body for electrophotography can be appropriately selected and used. Materials having a mobility of a hole of $10^2$ $cm^2/V \cdot s$ (electric field intensity $10^4$ to $10^5$ V/cm) or higher are preferable. A hole injecting material may be organic or inorganic.

As specific examples, there may be triazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, oxazole derivatives, styrylanthracene derivatives, fluorenone derivatives, hydrazone derivatives, stilbene derivatives, silazane derivatives, polysilane, aniline-based copolymers, electrically conductive polymer oligomers (particularly, thiophene oligomer), porphyrin compounds, aromatic tertiary amine compounds, styrylamine compounds, the aforementioned aromatic dimethylidyne-based compounds shown as an organic light emitting material, and inorganic semiconductors such as p-type-Si, p-type-SiC or the like.

As the hole injecting material, it is preferable to use porphyrin compounds, aromatic tertiary amine compounds or styrylamine compounds, and it is particularly preferable to use aromatic tertiary amine compounds.

As examples of the porphyrin compound, there may be porphine, 1,10,15,20-tetraphenyl-21H,23H-porphine copper (II), 1,10,15,20-tetraphenyl-21H,23H-porphine zinc (II), 5,10,15,20-tetrakis(pentafluorophenyl)-21H,23H-porphine, silicon phthalocyanine oxide, aluminum phthalocyanine chloride, phthalocyanine (non-metal), dilithium phthalocyanine, copper tetramethylphthalocyanine, copper phthalocyanine, chromium phthalocyanine, zinc phthalocyanine, lead phthalocyanine, titanium phthalocyanine oxide, magnesium phthalocyanine, copper octamethyl phthalocyanine or the like.

As examples of the aromatic tertiary amine compound and styrylamine compound, there may be those having two fused aromatic rings in a molecule such as N,N,N',N'-tetraphenyl-4,4'-diaminophenyl, N,N'-diphenyl-N,N'-bis-(3-methylphenyl)-[1,1'-biphenyl]-4,4'-diamine, 2,2-bis(4-di-p-tolylaminophenyl)propane, 1,1-bis(4-di-p-tolylaminophenyl)cyclohexane, N,N,N',N'-tetra-p-tolyl-4,4'-diaminobiphenyl, 1,1-bis(4-di-p-tolylaminophenyl)-4-phenylcyclohexane, bis(4-dimethylamino-2-methylphenyl)phenylmethane, bis(4-di-p-tolylaminophenyl)phenylmethane, N,N'-diphenyl-N,N'-di(4-methoxyphenyl)-4,4'-diaminobiphenyl, N,N,N',N'-tetraphenyl-4,4'-diaminodiphenyl ether, 4,4'-bis(diphenylamino)quadriphenyl, N,N,N-tri(p-tolyl)amine, 4-(di-p-tolylamino)-4'-[4(di-p-tolylamino)styryl]stilbene, 4-N,N-diphenylamino-(2-diphenylvinyl)benzene, 3-methoxy-4'-N,N-diphenylaminostilbene, N-phenylcarbazole, and 4,4'-bis[N-(1-naphthyl)-N-phenylamino]biphenyl, and 4,4',4"-tris[N-(3-methylphenyl)-N-phenylamino]triphenylamine in which three triphenylamine units are connected in a star burst form.

As a material suitable for use in a wet process by formulating into a solution among hole injection layer materials, a water-soluble PEDOT/PSS (polyethylene dioxythiophene/polystyrene sulfonate) mixed resin is known.

A film thickness of the hole injection layer is not particularly limited, but can be appropriately set according to the situations, and usually a range of 5 nm to 5 µm is preferable.

(c) Electron Injection Layer

A material for an electron injection layer provided optionally (hereinafter, referred to as "electron injecting material") may be any material as far as it has function of transmitting an electron injected from a cathode to a light emitting layer. Generally, a material having higher electron affinity as compared with electron affinity of an organic light emitting material and having smaller work function as compared with a work function of a cathode (minimum work function in the case where a cathode contains multiple components) is desirable. In this respect, at a place where a difference in an energy level is extremely large, there exists a large electron injection barrier, being not preferable. It is preferable that electron affinity of an electron injecting material is the approximately same extent of a magnitude of a work function of a cathode or electron affinity of an organic light emitting material. An electron injecting material may be organic or inorganic.

As examples, there may be nitro-substituted fluorenone derivatives, anthraquinodimethane derivatives, diphenylquinone derivatives, thiopyran dioxide derivatives, heterocyclic tetracarboxylic acid anhydrides such as naphthaleneperylene or the like, carbodiimide, fluorenylidenemethane derivatives, anthrone derivatives, oxadiazole derivatives, a series of electron transmitting compounds disclosed as a material for a light emitting layer in JP-A No. Sho. 59-194393, thiazole derivatives in which an oxygen atom of an oxadiazole ring is substituted with a sulfur atom, quinoxaline derivatives having a quinoxaline ring known as an electron withdrawing group, metal complexes of 8-quinolinol derivatives (e.g. tris(8-quinolinol)aluminum), tris(5,7-dichloro-8-quinolinol)aluminum, tris(5,7-dibromo-8-quinolinol)aluminum, tris(2-methyl-8-quinolinol)aluminum, tris(5-methyl-8-quinolinol)aluminum, bis (8-quinolinol) zinc or the like, and metal complexes in which a central metal of these metal complexes is substituted with In, Mg, Cu, Ca, Sn, Ga or Pb), metal free or metal phthalocyanines, said metal free or metal phthalocyanines in which a terminal thereof is substituted with an alkyl group, a sulfone group or the like, the aforementioned distyrylpyrazine derivatives shown as an organic light emitting material, inorganic semiconductors such as n-type-Si, n-type-SiC or the like.

A film thickness of an electron injection layer is not particularly limited, but can be appropriately set according to the situations, and usually a range of 5 nm to 5 µm is preferable.

<Anode>

As a material for an anode, a metal, an alloy, an electrically conductive compound or a mixture thereof having a high work function (e.g. 4 eV or more) is preferably used. For example, there may be metals such as Au or the like and electrically conductive transparent materials such as CuI, ITO, tin oxide, zinc oxide or the like. The anode can be produced by forming a thin film of the aforementioned material by a method such as a vapor deposition method, a sputtering method or the like. When light emission (EL light) from a light emitting layer is taken from an anode side, transmittance of the EL light of an anode is preferably 10% or more. In addition, it is preferable that a sheet resistance of an anode is a few hundreds Ω/square or less. A film thickness of the anode depends on a material, and is generally selected in a range of 10 nm to 1 μm, preferably 10 nm to 200 nm.

In order to form an electrode made of a liquid metal, it is necessary to seal a liquid metal having flowability in a form of layer at a predetermined position adjacent to an organic material layer. Hereinafter, using a process for producing an organic EL element 1 having a structure in which an anode 3, a light emitting layer 4, a cathode 5 and a second substrate 9 are laminated in this order on one side of a first substrate 2 as an example, some production methods will be explained.

In the production method explained below, all of organic material layers including a light emitting layer 4, and a hole injection layer and an electron injection layer adjacent to the light emitting layer 4 are formed by a wet process such as coating or the like, and further a cathode 5 is formed by a wet process such as coating or the like using a liquid metal without using vapor deposition, thereby, an organic EL element having high performance can be produced.

However, in the production method explained below, an organic material layer may be formed by a vapor phase process such as vapor deposition or the like. Even in that case, an effect to prevent an electrode from breaking can be obtained by a cathode formed by a liquid metal.

Figure 2A:
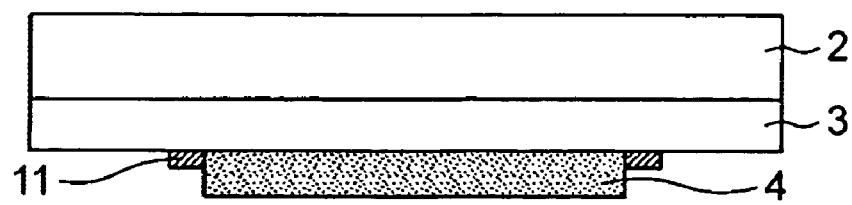
FIGS. 2A to 2C are views showing steps of producing an organic EL element of the present invention.

FIG. 2 shows a first method for producing an organic EL element 1. In this method, first, as shown in FIG. 2A, a transparent electrode which is an anode 3 is formed on one side of a first substrate 2 by a proper method such as vapor deposition or the like, and a light emitting layer 4 which is an organic material layer is further formed thereon. The light emitting layer 4 is sized such that it is accommodated in a storing portion 9a described hereinafter. Also, in order to prevent short circuit between an anode and a cathode, if necessary, an insulating layer 11 is formed so as to surround a periphery of the light emitting layer 4. For the insulating layer 11, a proper insulating material selected from a resist, a photosensitive resin or the like is used.

Figure 2B:
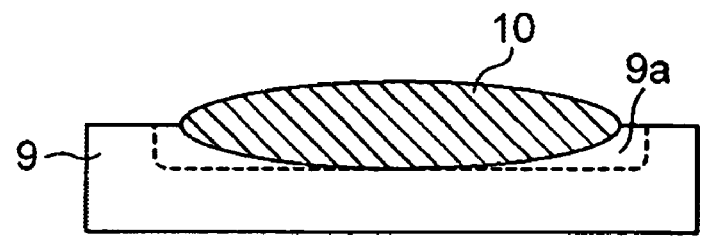

On the other hand, separately, as shown in FIG. 2B, a second substrate 9 having a hollow storing portion 9a is prepared on one side, and a liquid metal 10 is filled into the storing portion. The storing portion 9a of the second substrate can be formed by depressing a substrate itself so that a predetermined depth is possessed in conformity with a total thicknesses of the light emitting layer 4 and a cathode 5, and a periphery is defined in conformity with a two-dimensional shape of the cathode, to form a concave part, or forming a barrier on a substrate surface with the use of any proper material. A size may not be particularly limited. As an example, a transparent substrate having the size of 30 to 40 cm in length of one side and about 1.1 mm in thickness, wherein a concave part having a two-dimensional size smaller than that of the transparent substrate and a depth of about 100 μm is formed as a storing portion, may be used.

Figure 2C:
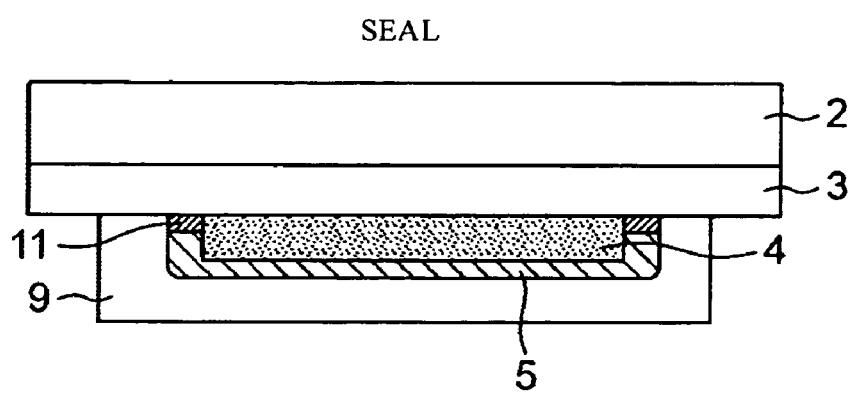

As shown in FIG. 2C, the first substrate 2 and the second substrate 9 are laminated so that the light emitting layer 4 and the storing portion 9a are faced, and a liquid metal is sealed into the storing portion, thereby forming an organic material layer and a gap part having a predetermined two-dimensional shape, which is disposed so as to face to the organic material layer, and a cathode 5 in which a liquid metal is filled into the gap part is also formed.

FIG. 3 shows a second method for producing an organic EL element 1. In this method, first, as shown in FIG. 3A, a transparent electrode which is an anode 3, a light emitting layer 4 which is an organic material layer having such a size capable of being accommodated in a storing portion 9a, and a pattern-like insulating layer 11 surrounding the light emitting layer 4 are formed on one side of a first substrate in advance as in the aforementioned first method (see FIG. 2).

Figure 3A:
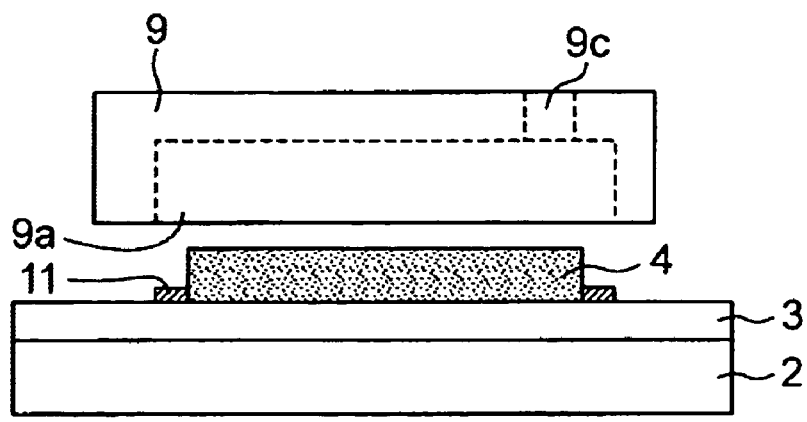
FIGS. 3A to 3D are views showing other method for producing an organic EL element of the present invention.

On the other hand, separately, as shown in FIG. 3A, a substrate having, on one side, a storing portion 9a in which a periphery is defined so that a predetermined depth is possessed in conformity with a total thicknesses of a light emitting layer 4 and a cathode 5, and having a penetrating aperture and/or a notch portion which is to be a pore potion 9c communicating with the outside when an upper opening of the storing portion is closed is prepared. The penetrating aperture and/or the notch portion may be, for example, a pore portion penetrating through an opposite second substrate, or may be an opening in a part of a sealing part (barrier which defines a periphery of the storing portion), which bonds the first substrate 2 having the light emitting layer 4 formed to a second substrate 9 so as to face each other.

Figure 3B:
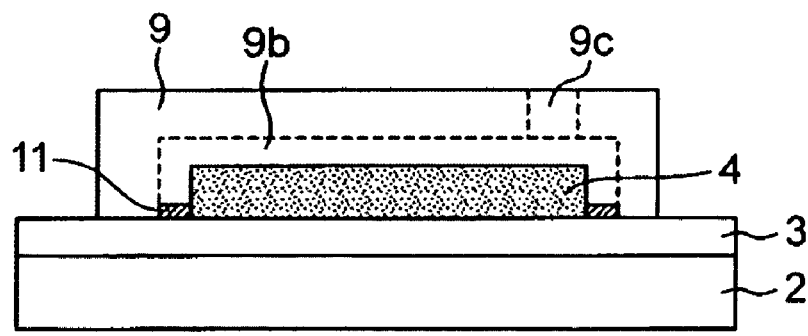

Then, as shown in FIG. 3B, by laminating the fist substrate 2 and the second substrate 9 so that the light emitting layer 4 and the storing portion 9 are faced to each other, a gap part 9b is formed. The gap part has one or more pore portions 9c communicating with the outside. This state is defined as vacant element.

By injecting a liquid metal into the gap part 9b through the pore portion 9c of the vacant element, a cathode 5 is formed. When a liquid metal is allowed to be naturally injected utilizing capillarity, two or more pore portions are disposed, and it is preferable to use at least one pore portion for releasing the air therein to the outside.

Figure 3C:
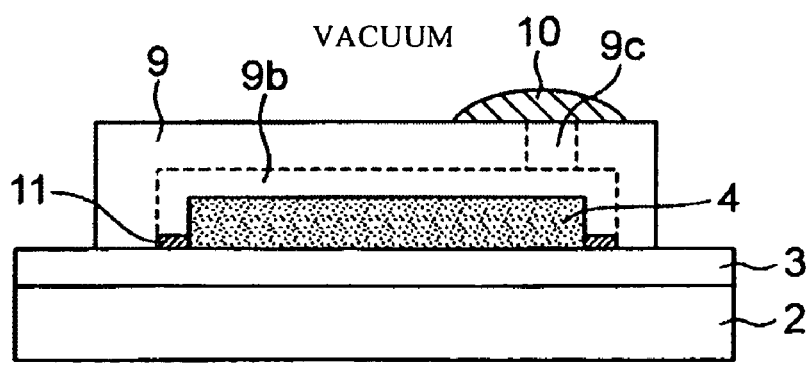
Figure 3D:
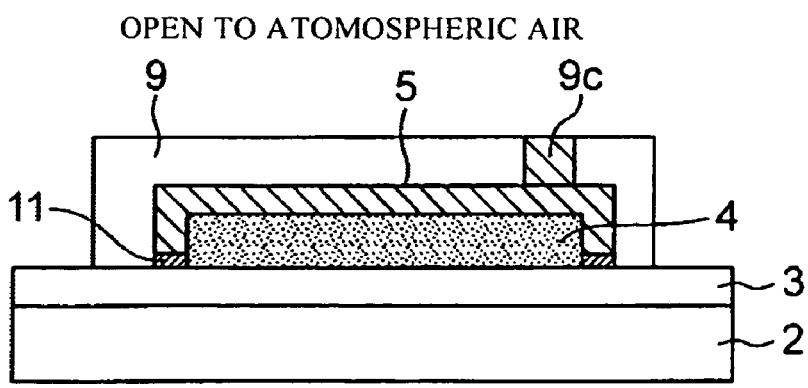

A preferable injecting method is shown by FIG. 3C to FIG. 3D. In this method, as shown in FIG. 3C, a liquid metal 10 is arranged on or near the pore portion 9c provided in a gap part of the vacant element (at least one when there are plural pore portions), and vacuum evacuation (vacuuming) of the gap part 9b is performed.

The vacuum evacuation can be performed, for example, by a so-called vacuuming injection method in which a vacant element is arranged in a vacuum camber, the whole interior of chamber including a gap part and surrounding space of the gap part is vacuum-evacuated, and the interior of the chamber is thereafter opened to the atmospheric air, thereby, a difference in a air pressure between the inside and the outside of the vacant element is utilized. By such a vacuum injection method, an element in the light emitting state having higher uniformity can be obtained.

The gap part 9b is usually formed with a narrow width which is 1 mm or less. A liquid metal 10 is flown in the narrow gap part to generate convection so that an alkali metal which is not deteriorated in the interior of an alloy is uniformly introduced on a surface of the light emitting layer 4, thereby, a cathode 5 is formed. Accordingly, the light emitting state having higher uniformity can be obtained.

FIG. 4 is a third method for producing an organic EL element 1. In this method, first, as shown in FIG. 4A, a first substrate and a second substrate are prepared as in the aforementioned second method (see FIG. 3), provided that two or more penetrating apertures and/or notch portions, which are to be pore portions 9c communicating with the outside when an upper opening of a storing portion is closed, are provided on the second substrate 9.

Figure 4A:
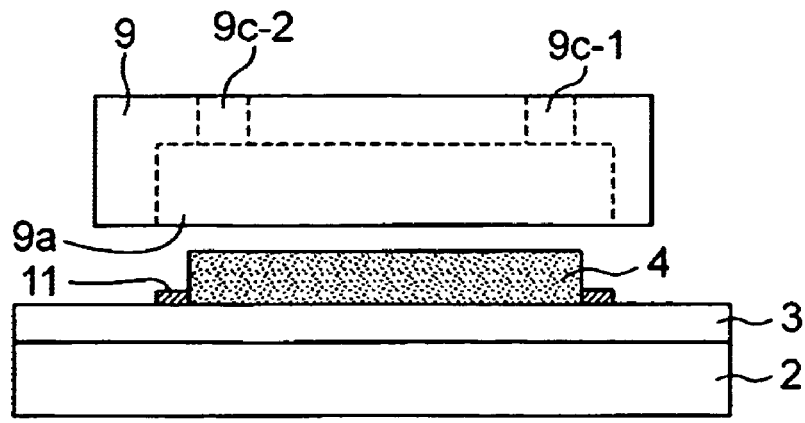
FIGS. 4A to 4D are views showing other method for producing an organic EL element of the present invention.
Figure 4B:
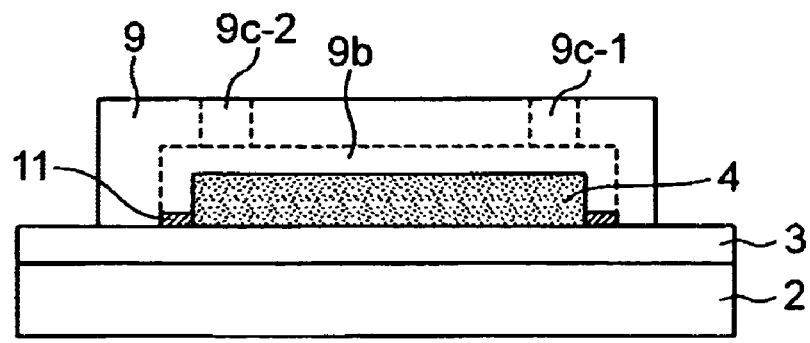

Then, as shown in FIG. 4B, by laminating the first substrate 2 and the second substrate 9 so that a light emitting layer 4 and a storing portion 9a are faced to each other, a gap part 9b is formed. The gap part has two or more pore portions (9c-1 and 9c-2) communicating with the outside. This state is defined as vacant element.

Figure 4C:
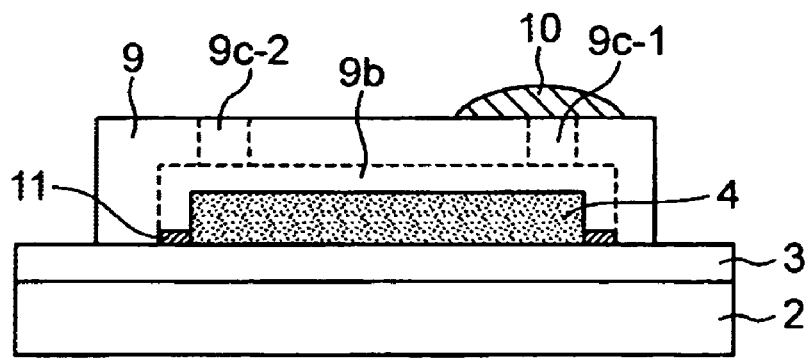
Figure 4D:
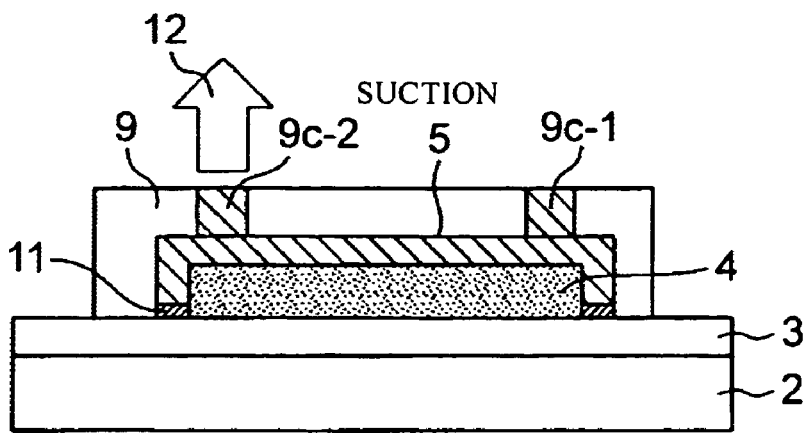

As shown in FIG. 4C, a liquid metal 10 is disposed in at least one pore portion 9c-1 of the gap part and, as shown in FIG. 4D, by performing sucking 12 of the air (gas) in the gap part through at least one pore portion 9c-2 in which a liquid metal is not disposed, the liquid metal is injected into the gap part to form a cathode 5.

As a method which practically performs the third method, for example, there is a method shown in FIG. 5A and FIG. 5B. That is, one 9c-2 of pore portions (see front view) of the vacant element comprising a sealing material 16 is closed with an air tight partition member 15 provided with a packing 14, and the other pore portion 9c-1 is dipped in a container 13 retaining a liquid metal 10. The packing 14 may not be limited as far as it is a material capable of retaining air tightness. For example, when a rubber is used as the packing 14, air tightness is sufficiently retained, and attachment and detachment of the partition member 15 is easy. The liquid metal 10 in the container 13 may be heated, if necessary.

By sucking the air 12 from the interior of the vacant element with the partition member 15, the liquid metal is injected through the pore portion 9c-1. When such a partition member 15 is used, restriction due to the size of a vacuum chamber is eliminated, therefore, mass production of a metal electrode having large area becomes possible.

An organic EL element formed in the atmospheric air by the first to third methods is excellent in light emitting property such as a voltage and a luminance, however, light emitting uniformity is not necessarily sufficient. It is presumed that in an electrode having an extent of an area, unevenness of the light emission in a plane is easily generated, and an oxidized film is formed on an electrode surface in contact with a light emitting layer. In order to improve light emitting uniformity, it is desirable to form an electrode under the environment where the atmosphere is replaced with an inert gas such as nitrogen, argon, a mixed gas of nitrogen and argon or the like, for example, in a so-called glove box.

Also in the aforementioned vacuum injection method, by arranging a vacuum chamber under the inert gas environment, exposure to the atmospheric air is eventually eliminated, being advantageous in long term reliance of an element.

In these methods (see FIG. 2, FIG. 3 and FIG. 4), a cathode can be easily formed into a desired shape and film thickness by virtue of a shape of a storing portion 9a provided on a second substrate 9 or a gap part 9b formed by closing the storing portion. Therefore, as compared with a method of using a mask or performing etching after deposition in a vapor phase process such as vapor deposition or the like, it is easy to control an electrode shape. In addition, when an electrode shape is complex, a method of injecting a liquid metal into a gap part by the aforementioned vacuum evacuation or sucking the air (gas) is particularly effective.

Figure 6:
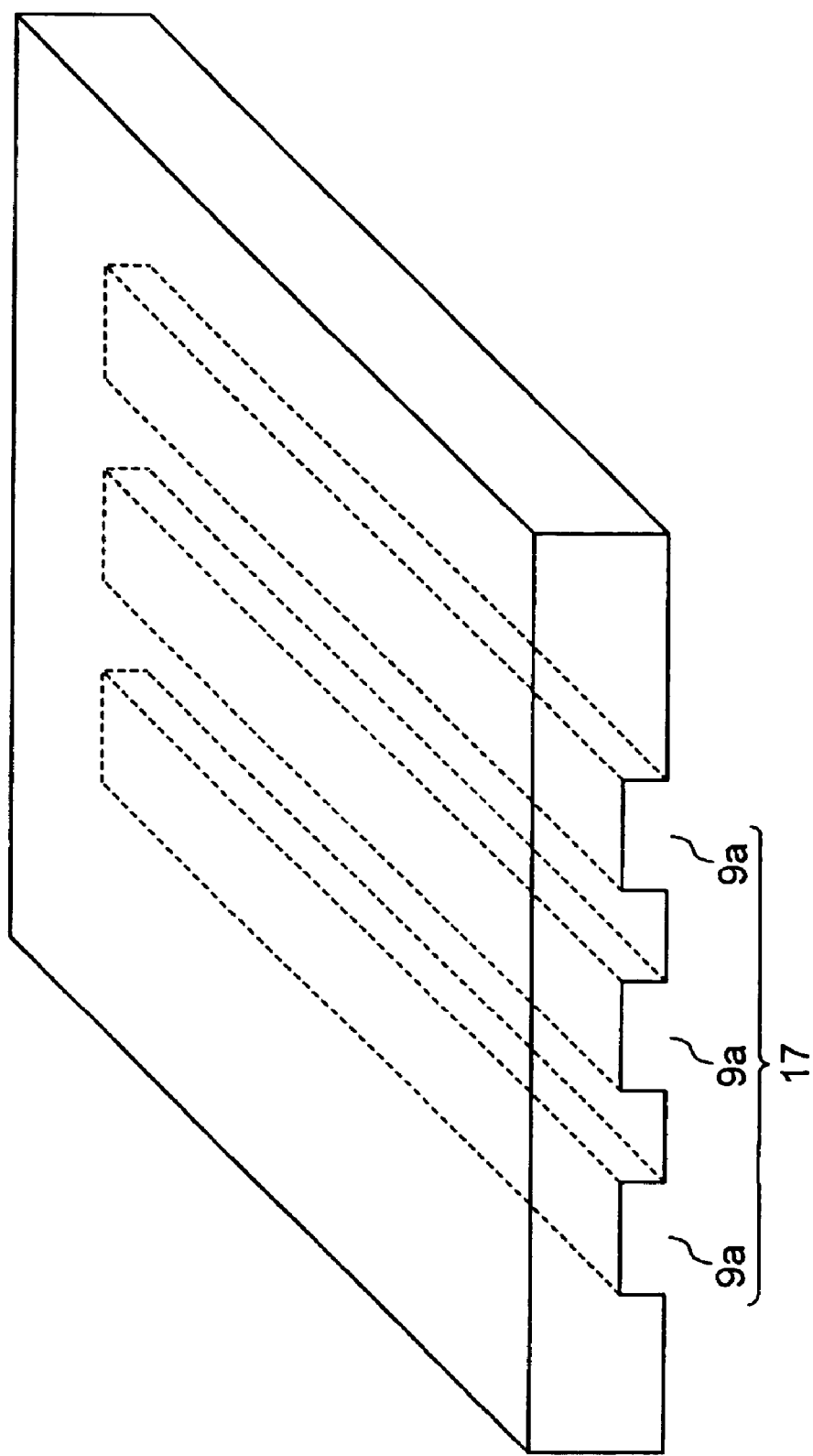
FIG. 6 is a view showing one example of a substrate in which concave parts are disposed in a striped form.
Figure 7A:
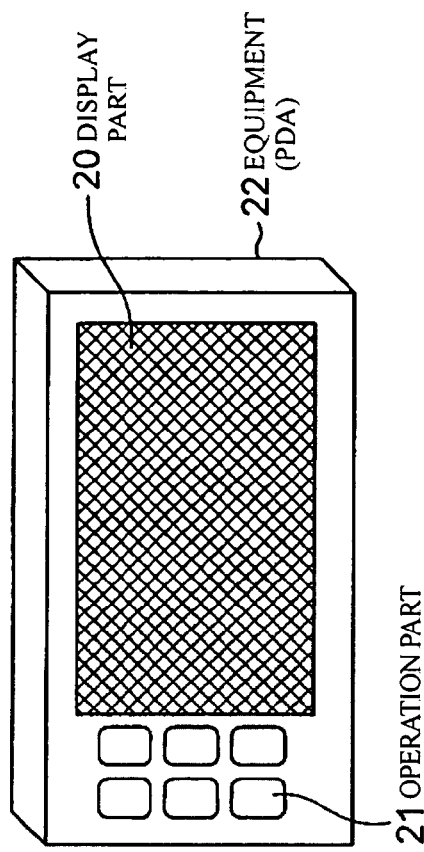
FIGS. 7A to 7D are examples of an electronic equipment in which a display utilizing an organic EL element of the present invention is mounted.
Figure 7B:
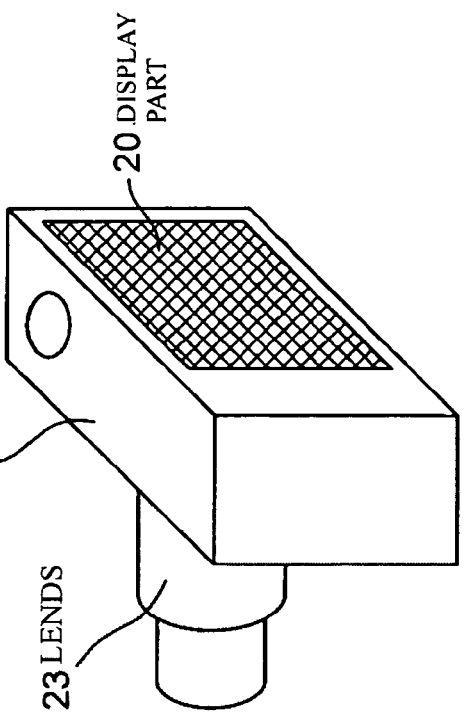
Figure 7C:
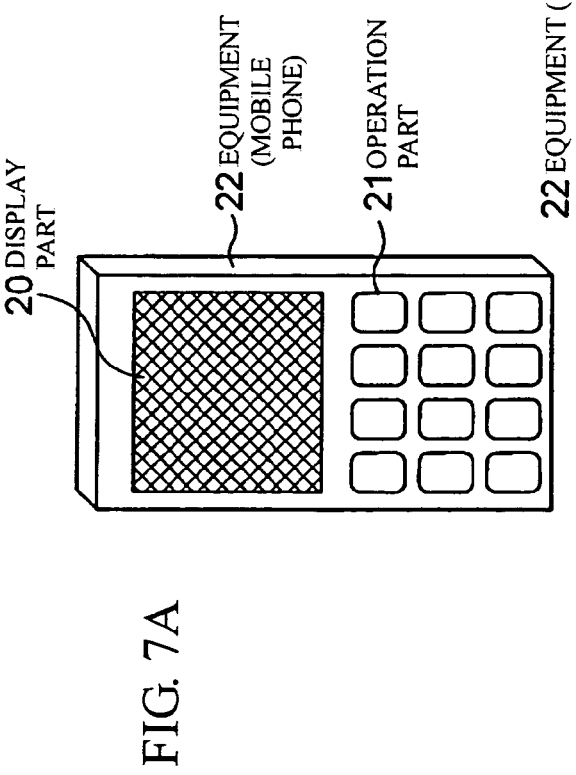
Figure 7D:
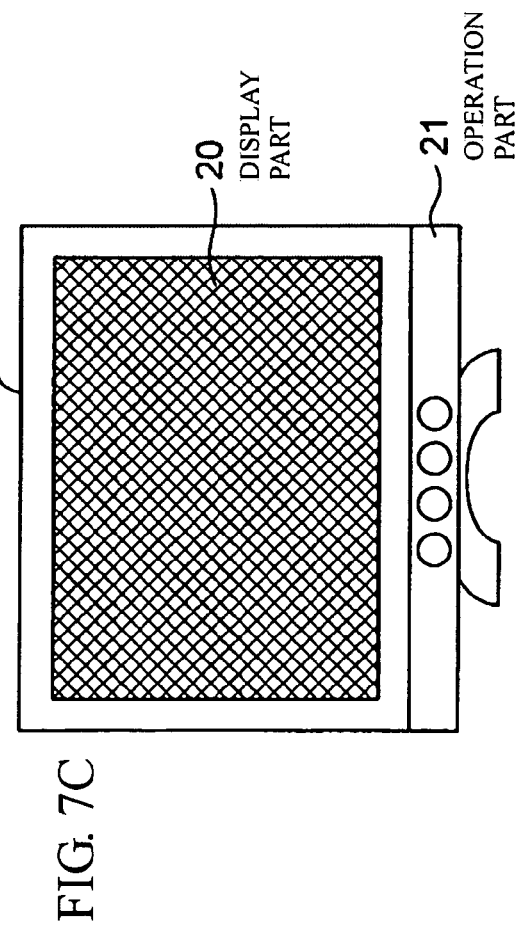

Particularly, as shown in FIG. 6, by using a substrate 9 having a stripe part 17 which is formed into a striped form containing a plurality of elongate storing portions 9a, a pixel electrode for constructing a display can be formed, thus being effective.

A display using an organic EL element made by the aforementioned method is installed in a variety of electronic equipments such as a mobile phone, PDA (Personal Digital Assistant) type terminal, PC (Personal Computer), television image receiver, video camera, digital camera or the like and constitutes a display part thereof.

FIG. 7 exemplifies some electronic equipments having a display part in which a display using an organic EL element is installed. FIG. 7A is a mobile phone, FIG. 7B is PDA, and FIG. 7C is PC. In all cases, a display part 20 and an operation part 21, at which buttons are arranged, are provided on a front surface. FIG. 7D is a digital camera, on rear surface of which a display part 20 is provided, and on a front surface of which a lens 23 is provided.

The present invention can be applied to a variety of elements not limiting to an organic EL element, as far as they are an organic functional element having a fundamental constitution in which a plurality of electrodes and an organic material layer are combined, and, for example, by applying a constitution of the present invention to an organic semiconductor element, an organic TFT element can be produced and utilized.

Figure 8A:
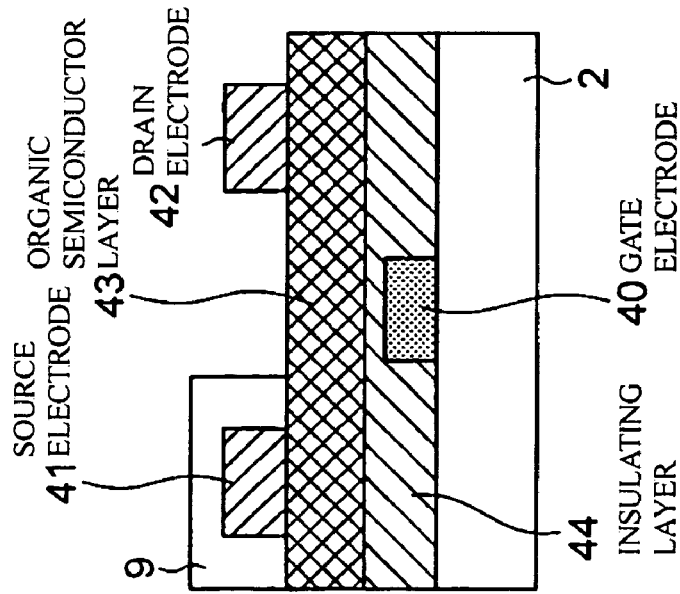
FIGS. 8A to 8C are schematic views showing a cross-sectional structure of an embodiment of an organic TFT element of the present invention.

FIG. 8 exemplifies some organic TFT elements to which the present invention can be applied. FIG. 8A is an example of a constitution of a planar electrode-structured TFT element, in which a gate electrode 40 is arranged at a predetermined position on a substrate 2, an insulating layer 44 covering the gate electrode 40 and an organic semiconductor layer 43 are laminated in this order, and a source electrode 41 and a drain electrode 42 are further arranged at a predetermined position on the organic semiconductor layer 43.

In FIG. 8A, a second substrate 9 having a concave part is laminated on the organic semiconductor layer 43 so that the concave part and a surface of the organic semiconductor layer are faced to each other to define a gap part, and a liquid metal is sealed in the gap part, thereby, a source electrode 41 is formed.

Figure 8B:
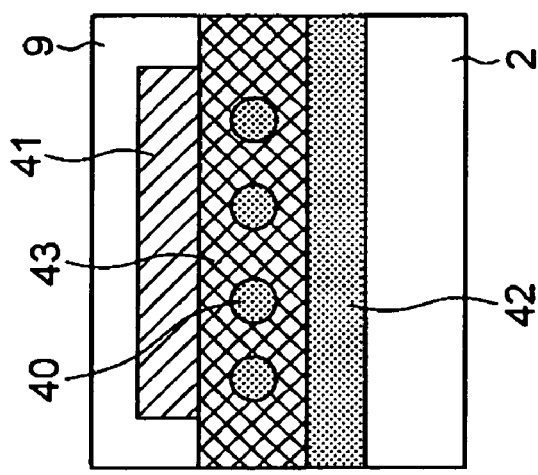
Figure 8C:
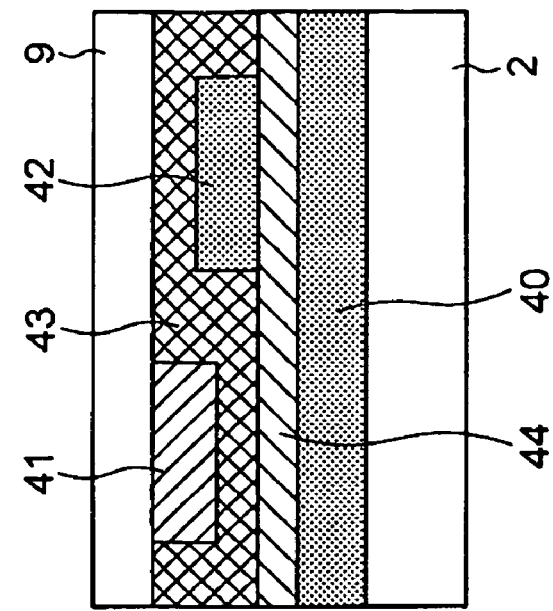

FIG. 8B is an example of a constitution of a static induction transistor (SIT) TFT element, in which a drain electrode 42, an organic semiconductor layer 43 and a source electrode 41 are laminated in this order on a substrate 2, and a gate electrode 40 is further arranged at a predetermined position in an organic semiconductor layer 43.

In FIG. 8B, a second substrate 9 having a concave part is laminated on the organic semiconductor layer 43 so that the concave part and a surface of the organic semiconductor layer are faced to each other as in the aforementioned FIG. 8A to define a gap part. Then, a liquid metal is sealed into the gap part, thereby, a source electrode 41 is formed.

FIG. 8C is an example of a constitution of a top and bottom contact-type TFT element, in which a gate electrode 40, an insulating layer 44 and an organic semiconductor layer 43 are laminated in this order on a substrate 2. Further, a drain electrode 42 contacting the insulating layer 44 and a source electrode 41 disposed adjacent to the insulating layer 44 via the organic semiconductor layer 43 are arranged at a predetermined position in the organic semiconductor layer 43.

In FIG. 8C, a concave part opening on an upper side is provided at a predetermined region of an organic semiconductor layer 43, and a flat second substrate 9 is laminated on the organic semiconductor layer 43, thereby, a gap part is defined. Then, a liquid metal is sealed in the gap part, thereby, a source electrode 41 is formed.

EXAMPLE

The present invention has been explained above, and the present invention will be explained in more detail based on Examples.

Example 1

(1) Preparation of Coating Liquid for Forming Organic EL Layer

A coating liquid for forming an organic EL layer having the following composition was prepared. Three kinds of coating liquids having different light emitting colors were prepared by changing a fluorescent dye in a composition of a coating liquid. When a fluorescent dye is coumarin 6, green light emitting having A peak at 501 nm can be obtained. When a fluorescent dye is perylene, blue light emitting having a peak at 460 to 470 nm can be obtained. When a fluorescent dye is DCM (dicyanomethylenepyran derivative), red light emitting having a peak at 570 nm can be obtained. These fluorescent dyes were used as light emitting materials for respective colors.

Figure 9:
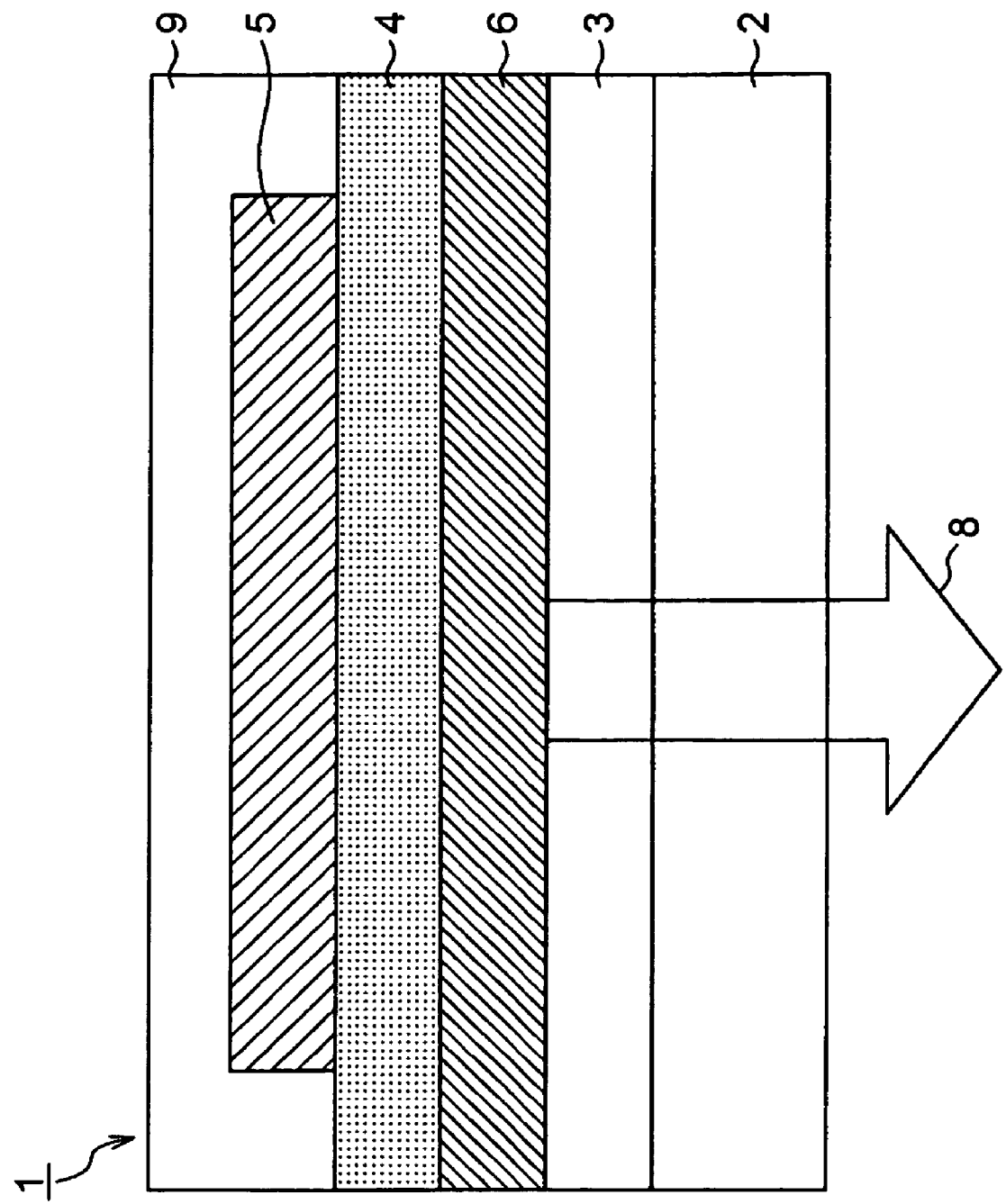
FIG. 9 is a schematic view showing a cross-sectional structure of an organic EL element produced in Example.

<Composition of Coating Liquid for Forming Organic EL Layer (Green, Blue or Red)>
Polyvinylcarbazole: 70 parts by weight
Oxadiazole compound: 30 parts by weight
Fluorescent dye (coumarin 6, perylene or DCM): 1 part by weight
Monochlorobenzene (solvent): 4,900 parts by weight (2) Preparation of Organic EL Element An organic EL element having a laminated structure shown in FIG. 9 was prepared according to the aforementioned first method. An ITO transparent electrode (anode 3) having a thickness of 200 nm was formed on one side of a glass substrate (first substrate 2) of a square (longitudinal 50 mm×traverse 50 mm×thickness 0.7 mm). After the substrate was washed, PEDOT/PSS (product name: Bayer CH8000; manufactured by Bayer) was coated by spin-coating at a thickness (film thickness after baking) of 80 nm, and baked at 160° C. to form a PEDOT layer (hole injection layer 6).

Then, the aforementioned coating liquid for forming the red organic EL layer was coated on the PEDOT layer by spin-coating at a thickness (film thickness after baking) of 80 nm, and baked at 130° C. to form a red light emitting layer (light emitting layer 4).

Subsequently, an appropriate amount of Ga was added dropwise to a concave part (storing portion) of a square (longitudinal 30 mm×traverse 30 mm×depth 100 μm) provided at a center on one side of a glass substrate (second substrate 9) of a square (longitudinal 50 mm×transverse 50 mm×thickness 0.7 mm). The above two substrates were overlaid so that the concave part and the light emitting layer are faced to each other, thus forming a cathode 5.

When the thus formed organic EL element 1 was driven by a direct current using ITO as an anode, and a liquid metal electrode as a cathode, light emission was initiated at 3.6 V, and a light emitting intensity of a luminance 100 cd/m$^2$ was obtained at 7.2 V.

Comparative Example 1

Figure 10:
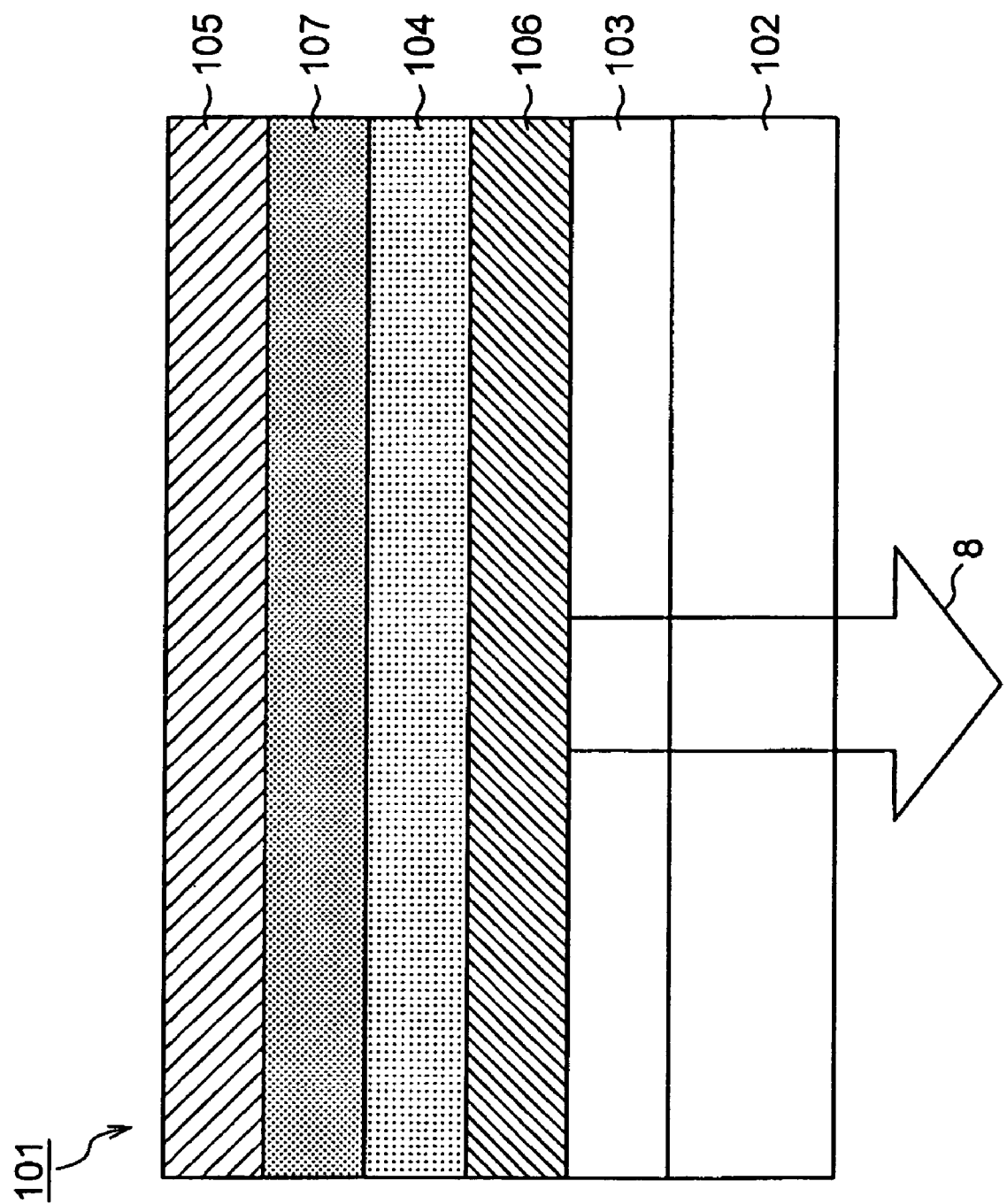
FIG. 10 is a schematic view showing a cross-sectional structure of a conventional organic EL element.

A general organic EL element shown in FIG. 10 having the same layer constitution as that of Example 1 except that, as a cathode, Al was vacuum-deposited on a light emitting layer was prepared. In an organic EL element of Comparative Example 1, light emission was initiated at 3.4 V, and a light emitting intensity of a luminance 100 cd/m$^2$ was obtained at 7.1 V. Comparative Example 1 had approximately the same light emitting property as that of the element of Example 1. As a result, it was confirmed that the organic EL element of Example 1 had light emitting element property equivalent to that of one having an electrode made by the vapor deposition method.

Example 2

According to the same manner as that of Example 1 except that a liquid metal of a cathode was the following alloy, an organic EL element was prepared:
Ga—In (75.5:24.5%)

Example 3

According to the same manner as that of Example 1 except that a liquid metal of a cathode was the following alloy, an organic EL element was prepared:
Ga—In—Sn (62.0:25.0:13.0%)

Example 4

According to the same manner as that of Example 1 except that a liquid metal of a cathode was the following alloy, an organic EL element was prepared:
Ga—In—Zn (67.0:29.0:4.0%)

Example 5

According to the same manner as that of Example 1 except that a liquid metal of a cathode was the following alloy, an organic EL element was prepared:
Ga—Sn (92.0:8.0%)

Example 6

According to the same manner as that of Example 1 except that a liquid metal of a cathode was the following alloy, an organic EL element was prepared:
Ga—Zn (95.0:5.0%)

Light Emitting Property of Examples 2 to 6

In all elements of Examples 2 to 6, a light emitting initiation voltage was 3.6 V to 3.7 V, a voltage at which the light is emitted at a luminance of 100 cd/m$^2$ was 7.2 V to 7.4 V, thus, approximately the same light emitting property as that of the organic EL element of Example 1 was obtained. In all of these elements, a melting point of a cathode material was lower than that of a Ga pure metal, and an electrode was a liquid electrode even when a temperature of the air was low.

Example 7

Ca was mixed into each of Ga or Ga alloys of Examples 1 to 6 at a ratio of 0.04% as expressed by a volume ratio. As a procedure of mixing, both metals were heated using a nitrogen replacement-type electric furnace, thereby, Ca was melted and mixed into a Ga or Ga alloy followed by cooling. In all cases, a melting point after mixing Ca was not changed from that of Ga or a Ga alloy forming matrix.

According to the same manners as those of Examples 1 to 6 except that a cathode was formed using a liquid metal in which Ca was added to corresponding Ga or a Ga alloy forming matrix, organic EL elements were prepared. In all of the elements, a light emitting initiation voltage was 2.0 V to 2.1 V, a voltage at which the light is emitted at a luminance of 100 cd/m$^2$ was 5.3 V to 5.5 V, and light emitting property of a lower voltage and a higher luminance than those of elements of Examples 1 to 6 were exhibited.

Comparative Example 2

A general organic EL element shown in FIG. 10 having the same layer constitution as that of Example 7 except that a cathode was formed by continuously vacuum-depositing CaAl was prepared. In Comparative Example 2, light emission was initiated at 2.0 V, and at 4.0 V, a light emitting intensity was a luminance of 100 cd/m².

Example 8

An organic EL element having the same layer constitution as that of Example 7 except that Ca was mixed into a cathode at a ratio of 0.1% or 0.5% as expressed by a volume ratio was prepared. In any case of Ca volume ratio of 0.1% or 0.5%, a light emitting initiation voltage was 2.0 V to 2.1 V, a voltage at which the light is emitted at a luminance of 100 cd/m² was 3.9 V to 4.1 V, light emitting property of further lower voltage and further higher luminance than those of Example 7 were exhibited. Thus, it was confirmed that light emitting property equivalent to that of a deposited Ca element by Comparative Example 2 was exhibited.

Example 9

The similar organic EL element as that of Example 8 except that Ca was mixed into a cathode at the same ratio as expressed by a weight ratio in Example 8 was prepared. In any case of Ca weight ratio of 0.1% or 0.5%, the same voltage and luminance property as that of Example 8 was exhibited, and it was confirmed that the light emitting property equivalent to that of a deposited Ca element by Comparative Example 2 was exhibited.

Example 10

Organic El elements having the same constructions as those of Example 8 and Example 9 except that Ca was changed into Li, Cs, Mg, Sr or Ba were prepared.

All elements exhibited the same voltage and luminance properties as those of Example 8 and Example 9, and it was confirmed that, by employing those alkali metals and alkaline-earth metals, good light emitting property is exhibited in any cases.

Comparative Example 3

A general organic EL element shown in FIG. 10 having the same layer constitution as that of Example 7 except that a cathode was formed by continuously vacuum-depositing CaAl, and a blue light emitting layer was formed using a coating liquid for forming a blue organic EL layer was prepared. In Comparative Example 3, light emission was initiated at 2.0 V, and at 5.8 V, a light emitting intensity was a luminance of 100 cd/m².

Comparative Example 4

A general organic EL element shown in FIG. 10 having the same layer constitution as that of Example 7 except that a cathode was formed by continuously vacuum-depositing LiAl, and a blue light emitting layer was formed using a coating liquid for forming a blue organic EL layer was prepared. In Comparative Example 4, light emission was initiated at 2.0 V, and at 3.8 V, a light emitting intensity was a luminance of 100 cd/m². It was confirmed that, in a blue light emitting layer, Li is better than Ca as an electron injection layer.

Example 11

An organic EL element having the same construction as that of Example 7 except that Ca was mixed into a cathode at a ratio of 0.1% or 0.5% as expressed by a volume ratio, and a blue light emitting layer was formed using a coating liquid for forming a blue organic EL layer was prepared.

In addition, an organic EL element having the same construction as that of Example 7 except that Ca was mixed into a cathode at a ratio of 0.1% or 0.5% as expressed by a weight ratio, and a blue light emitting layer was formed using a coating liquid for forming a blue organic EL layer was prepared.

In addition, an organic EL element having the same construction as that of Example 7 except that Li was mixed into a cathode at a ratio of 0.1% or 0.5% as expressed by a volume ratio, and a blue light emitting layer was formed using a coating liquid for forming a blue organic EL layer was prepared.

In addition, an organic EL element having the same construction as that of Example 7 except that Li was mixed into a cathode at a ratio of 0.1% or 0.5% as expressed by a weight ratio, and a blue light emitting layer was formed using a coating liquid for forming a blue organic EL layer was prepared.

In the elements of a Ca-containing metal, the same light emitting property as that of Comparative Example 3 was obtained, and in the elements of a Li-containing metal, the same light emitting property as that of Comparative Example 4 was obtained.

Example 12

According to the same manners as those of Examples 7 to 11 except that a vacuum injection method was performed by applying the aforementioned second method (see FIG. 3), organic EL elements were prepared. As a second substrate, a flat glass substrate was used. As a first substrate, a glass substrate was used, and a light emitting layer was formed on one side thereof. The first substrate is laid on the second substrate so as to have the light emitting layer face to the second substrate, and a peripheral part was bonded with UV sealing-adhesive to prepare a vacant element having a gap part in which a gap part was 5 μm to 500 μm. Then, an organic EL element was produced using the prepared vacant element.

In a range of a gap part of 5 μm to 500 μm, in all elements, the same properties as those of Examples 7 to 11 were obtained. In the present Example, since an electrode was formed in vacuum condition, light emitting uniformity on a light emitting surface was considerably improved than those of Examples 7 to 11.

Example 13

According to the same manner as that of Example 12 except that nitrogen replacement was performed after vacuuming in a vacuum injection method for a liquid metal electrode performed in Example 12, organic EL elements were prepared. In all elements, the same property as that of Example 12 was obtained, and light emitting uniformity was further improved, and thus a light emitting spot or the like was not observed. It can be confirmed that, by terminating vacuum with the use of nitrogen, the element was able to be prepared at the condition under which an alkali metal component was protected until the end of process.

Example 14

According to the same manner as that of Examples 7 to 11 except that gas suction was performed in a glove box replaced with nitrogen by applying the above third method (see FIG.

4), an organic EL element was prepared. As a second substrate, a flat glass substrate was used. As a first substrate, a glass substrate was used, and a light emitting layer was formed on one side thereof. The first substrate is laid on the second substrate so as to have the light emitting layer face to the second substrate, and a peripheral part was bonded with UV sealing-adhesive to prepare a vacant element having a gap part in which a gap part was 5 μm to 500 μm. Then, an organic EL element was produced using the prepared vacant element.

In a range of a gap part of 5 μm to 500 μm, in all elements, the same properties as those of Examples 7 to 11 were obtained. Light emitting uniformity was similarly improved as in Example 13, and a light emitting spot or the like was not observed. It can be confirmed that, by forming the electrode under the condition replaced with nitrogen, the element was able to be prepared at the condition under which an alkali metal component was protected until the end of process.

Example 15

When each of liquid metals prepared in Examples 7 to 14 was left in the atmospheric air, and similar elements were prepared after three months, the initial property and light emitting uniformity were able to be reproduced in all elements. It was confirmed that, by inclusion of an alkali metal or an alkaline-earth metal which is usually unstable in a liquid metal, the liquid metal can be stably stored.

Example 16

According to the same manners as those of Examples 7 to 14 except that a glass substrate in which one side was processed into a striped form having a plurality of concave parts was used as a second substrate, organic EL elements were prepared. The second substrate was prepared by forming a resist pattern having a striped form on one side of the glass substrate through a photolithography method, and then etching with hydrofluoric acid. By setting a line width at 50 μm to 300 μm and a distance between lines at 10 μm to 30 μm in each concave part, plural organic EL elements were prepared. All elements exhibited the light emitting state corresponding to a striped form. Thus, it was confirmed that all the elements can be used as an electrode for a display.

Example 17

According to Examples 1 to 16, general planar electrode-structured TFT element (FIG. 8A), a static induction transistor (SIT) TFT element (FIG. 8B), and top and bottom contact-type TFT element (FIG. 8C) were prepared.

As a first substrate 2, a glass substrate was used. As a gate electrode 40, Cr was used. As an insulating layer 44, SiO$_2$ was used. Further, as an organic semiconductor layer 43, polythiophene, which is an electrically conductive polymer material, was coated.

A source electrode 41 was formed using each of materials of Examples 1 to 16, a drain electrode 42 was formed using each of aluminum (Al), platinum (Pt) and gold (Au), and various combinations were set.

In TFT elements of any structures, a current flowing between a source electrode-drain electrode was changed depending on increase or decrease in a gate voltage, and transistor operation was confirmed.

Example 18

According to the same manners as those of Examples 1 to 17 except that each of a glass substrate used as the first substrate and a glass substrate having a storing portion used as the second substrate was changed to a plastic substrate, organic EL elements having the similar construction were prepared.

Operation was confirmed by bending the elements. Deterioration was not caused until there was an operation failure due to crack of the substrate.

Comparative Example 5

According to the same manners as those of Comparative Examples 1 to 4 except that each of the first and second substrates was changed to a plastic substrate as in Example 18, organic EL elements having the similar construction were prepared.

Operation was confirmed by bending elements. Deterioration due to electrode breaking was caused frequently before observing an operation failure due to a crack of the substrate. By comparing the above Example 18 and Comparative Example 5, it was confirmed that the electrode breaking was not caused because a liquid metal was used as an electrode in Example 18.

What is claimed is:

1. An organic functional element at least comprising more than one electrode and an organic material layer, wherein at least one electrode comprises a metal in a liquid state that contains at least one selected from the group consisting of an alkali metal and an alkaline-earth metal, and wherein a total amount of the alkali metal and/or the alkaline-earth metal contained in the liquid metal is selected from the group consisting of 0.01 to 1% by volume and 0.01 to 1% by weight, and wherein at least one electrode has a gap part filled with the metal in the liquid state, the gap part being defined by determining a periphery of a space between the organic material layer and a substrate disposed so as to face the organic material layer.

2. An organic functional element according to claim 1, wherein the liquid metal forming the electrode contains Ga or a Ga alloy.

3. An organic functional element according to claim 1, wherein the liquid metal forming the electrode contains a Ga alloy comprising at least Ga and one or more other metals selected from the group consisting of In, Sn and Zn.

4. An organic functional element according to claim 1, wherein the alkali metal and/or the alkaline-earth metal is selected from the group consisting of Ca, Li, Cs, Mg, Sr and Ba.

5. A method for producing an organic functional element defined by claim 1 comprising steps of: laminating a first substrate having the organic material layer and a second substrate having a storing portion facing the organic material layer, the storing portion being defined by determining a periphery of the storing portion so as to have a predetermined depth and be capable of keeping the liquid metal which constitutes at least one electrode inside the determined periphery; and sealing the liquid metal in the storing portion to form the electrode.

6. A method for producing an organic functional element defined by claim 1 comprising steps of: forming a gap part which is defined by determining a periphery of a space between the organic material layer and a substrate disposed so as to face the organic material layer and provided with one or more holes leading to the exterior; and injecting the liquid metal into the gap part through the hole to form at least one electrode.

7. A method for producing an organic functional element according to claim 6, wherein the liquid metal is injected to the gap part by placing the liquid metal on at least one hole of the gap part and evacuating the gap part.

8. A method for producing an organic functional element according to claim 6, wherein the liquid metal is injected to the gap part by forming the gap part having two or more holes, placing the liquid metal on at least one hole of the gap part, and suctioning a gas from at least one hole of the gap part not having the liquid metal placed.

9. A method for producing an organic functional element according to claim 6, wherein the gap part is placed in an atmosphere of an inert gas to inject the liquid metal.

10. A method for producing an organic functional element according to claim 9, wherein the inert gas is nitrogen, argon or a mixed gas of nitrogen and argon.

11. A method for producing an organic functional element according to claim 5, wherein a form of the electrode is defined to a certain form depending on a form of the storing portion.

12. A method for producing an organic functional element according to claim 6, wherein a form of the electrode is defined to a certain form depending on a form of the gap part.

13. A method for producing an organic functional element according to claim 11, wherein the storing portion is formed in a striped form.

14. A method for producing an organic functional element according to claim 12, wherein the gap part is formed in a striped form.

15. A method for producing an organic functional element according to claim 5, wherein the substrate having the storing portion is made of glass, metal, ceramic, resin or a composite material having two or more kinds selected from the group consisting of glass, metal, ceramic and resin mixed or laminated.

16. A method for producing an organic functional element according to claim 6, wherein the substrate disposed so as to face the organic material layer is made of glass, metal, ceramic, resin or a composite material having two or more kinds selected from the group consisting of glass, metal, ceramic and resin mixed or laminated.

17. An organic EL element having a structure of the organic functional element defined by claim 1.

18. An organic EL element according to claim 17, wherein the electrode is a negative electrode.

19. A method for producing an organic EL element comprising the steps of producing the organic functional element defined by claim 5.

20. A method for producing an organic EL element comprising the steps of producing the organic functional element defined by claim 6.

21. An organic semiconductor element having a structure of the organic functional element defined by claim 1.

22. A method for producing an organic semiconductor element comprising the steps of producing the organic functional element defined by claim 5.

23. A method for producing an organic semiconductor element comprising the steps of producing the organic functional element defined by claim 6.

24. An organic TFT element having a structure of the organic functional element defined by claim 1.

25. A method for producing an organic TFT element comprising the steps of producing the organic functional element defined by claim 5.

26. A method for producing an organic TFT element comprising the steps of producing the organic functional element defined by claim 6.

* * * * *